United States Patent
Kurosawa

(10) Patent No.: US 11,521,950 B2
(45) Date of Patent: Dec. 6, 2022

(54) SEMICONDUCTOR MANUFACTURING APPARATUS AND METHOD OF MANUFACTURING SEMICONDUCTOR DEVICE

(71) Applicant: Kioxia Corporation, Minato-ku (JP)

(72) Inventor: Tetsuya Kurosawa, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 175 days.

(21) Appl. No.: 16/996,122

(22) Filed: Aug. 18, 2020

(65) Prior Publication Data

US 2021/0082867 A1  Mar. 18, 2021

(30) Foreign Application Priority Data

Sep. 17, 2019 (JP) .............................. JP2019-168748

(51) Int. Cl.
*H01L 23/00* (2006.01)

(52) U.S. Cl.
CPC .............. *H01L 24/81* (2013.01); *H01L 24/75* (2013.01); *H01L 2224/751* (2013.01); *H01L 2224/75621* (2013.01); *H01L 2224/75743* (2013.01); *H01L 2224/75744* (2013.01); *H01L 2224/75745* (2013.01); *H01L 2224/75901* (2013.01); *H01L 2224/81203* (2013.01)

(58) Field of Classification Search
CPC .......... H01L 24/75; H01L 2224/75743–75745
See application file for complete search history.

(56) References Cited

U.S. PATENT DOCUMENTS

| 8,720,519 | B2 * | 5/2014 | Yamakami | H01L 24/75 156/60 |
| 10,872,875 | B2 * | 12/2020 | Lee | H01L 24/73 |
| 11,024,596 | B2 * | 6/2021 | Watanabe | H01L 21/6838 |
| 11,373,975 | B2 * | 6/2022 | Seyama | H01L 23/29 |
| 2017/0103963 | A1 * | 4/2017 | Sakuma | H01L 24/17 |

FOREIGN PATENT DOCUMENTS

| JP | 11-67842 A | 3/1999 |
| JP | 2011-135108 A | 7/2011 |
| JP | 5612963 B2 | 10/2014 |
| JP | 5827043 B2 | 12/2015 |
| JP | 2018-93156 A | 6/2018 |

* cited by examiner

*Primary Examiner* — David A Zarneke
(74) *Attorney, Agent, or Firm* — Oblon, McClelland, Maier & Neustadt, L.L.P.

(57) ABSTRACT

According to one embodiment, in a semiconductor manufacturing apparatus, a controller relatively moves a bonding tool and a stage close to each other while causing a semiconductor chip to adhere by suction to a surface via a tape using at least a first suction structure in a first period. In a second period, the controller controls the temperature of the bonding tool to a first target temperature while keeping substantially equal to a target pressure a pressure applied to the semiconductor chip by the bonding tool. In a third period, the controller controls a relative distance between the bonding tool and the stage so that the pressure applied to the semiconductor chip by the bonding tool is kept equal to the target pressure and controls the temperature of the bonding tool to a second target temperature. The second target temperature is higher than the first target temperature.

17 Claims, 24 Drawing Sheets

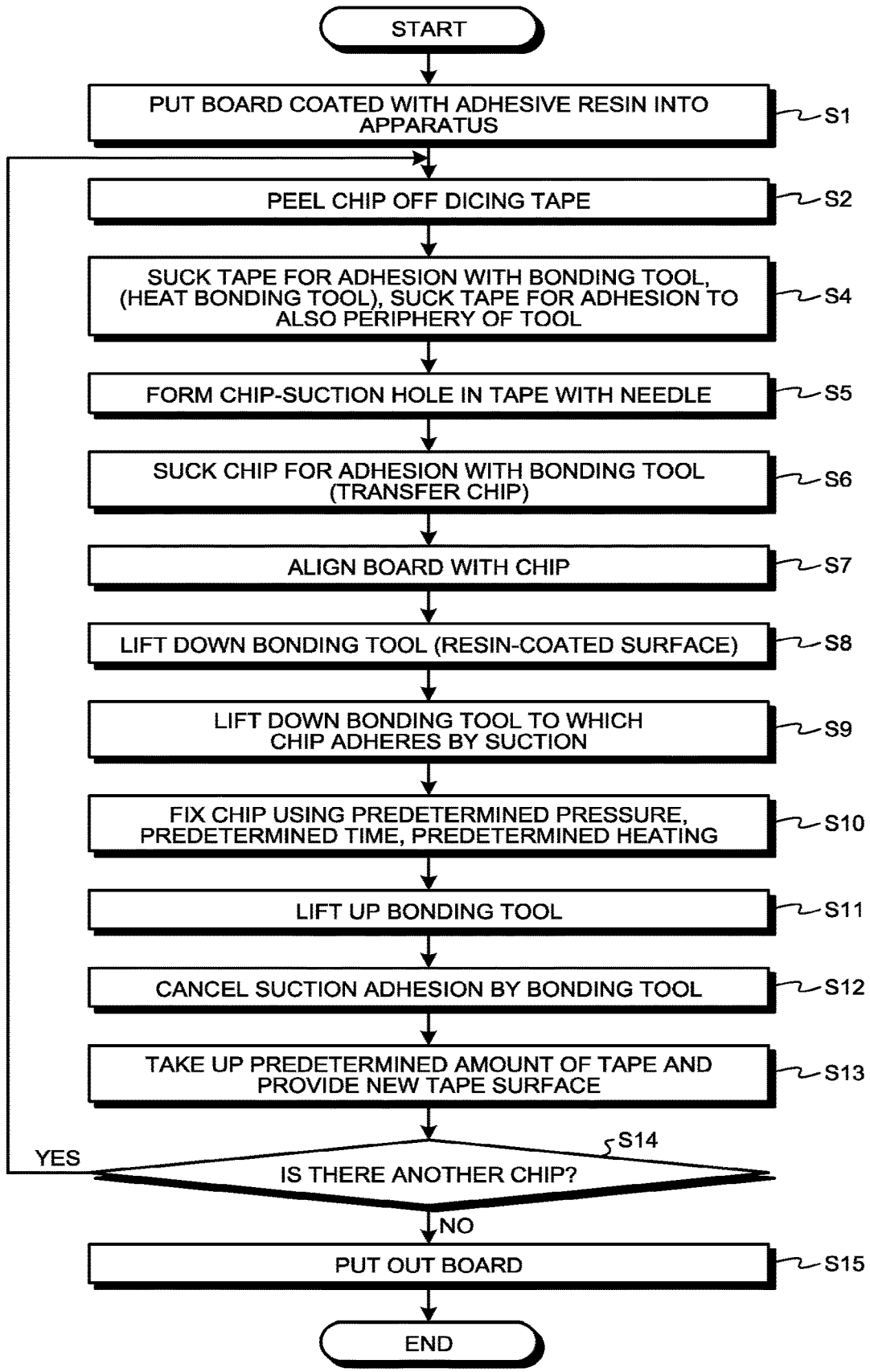

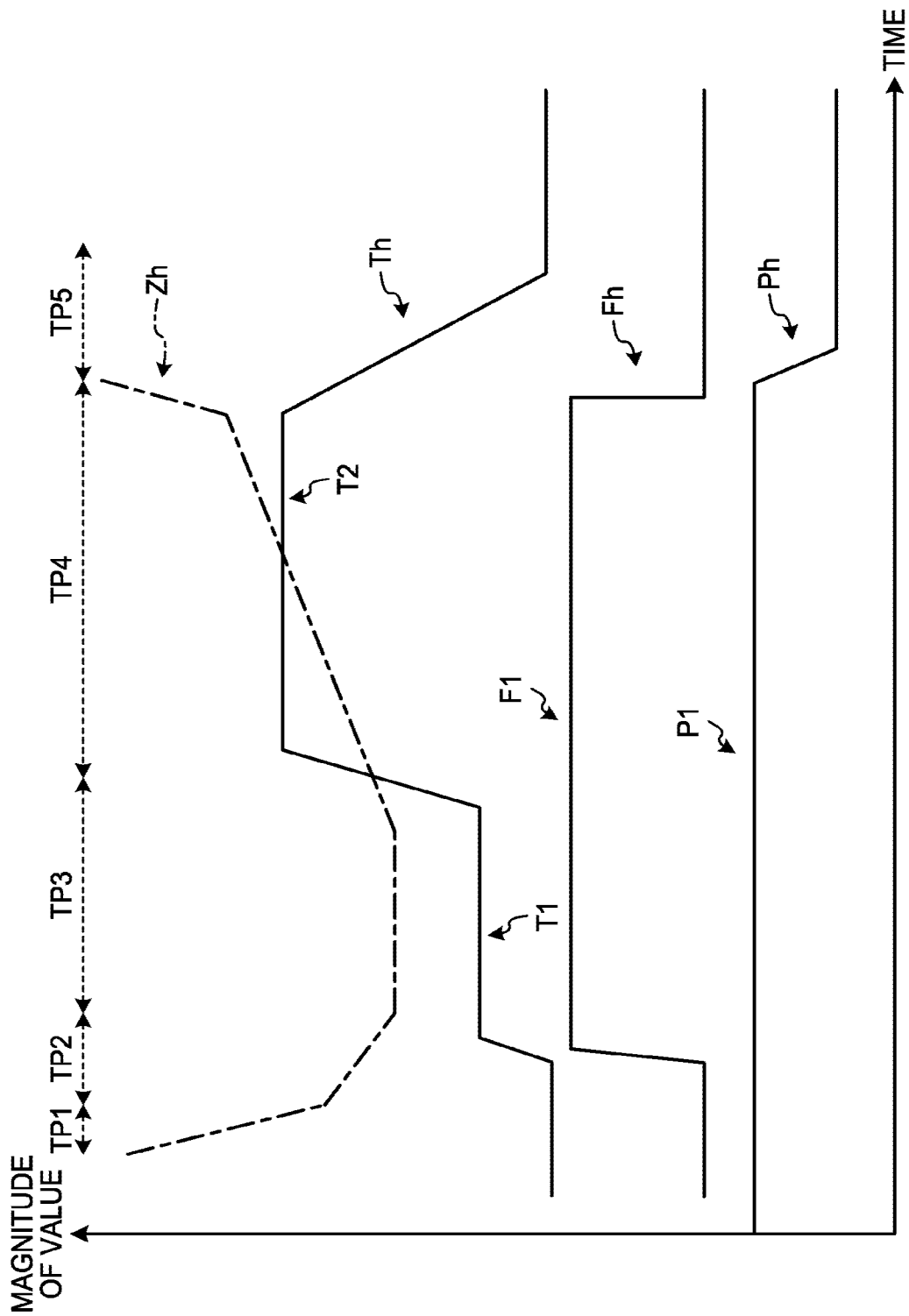

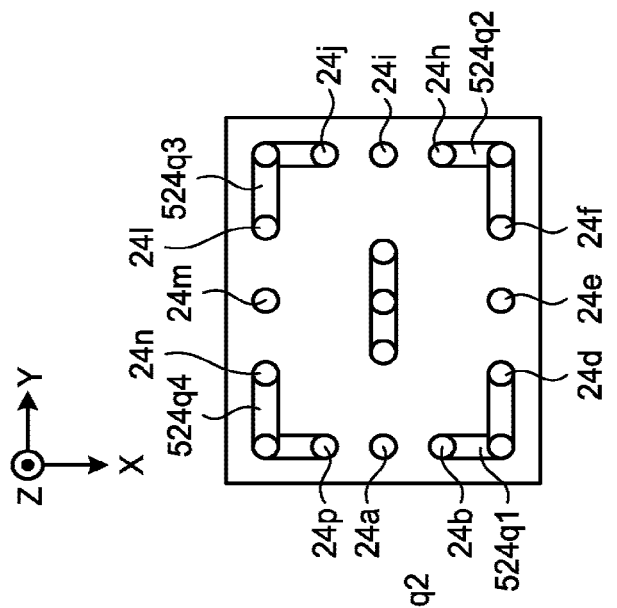
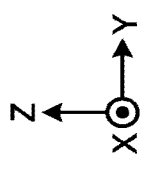
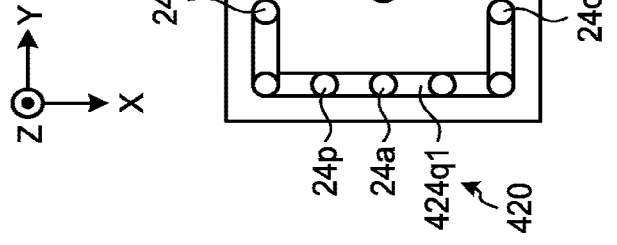
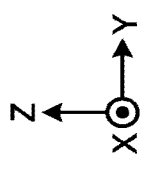
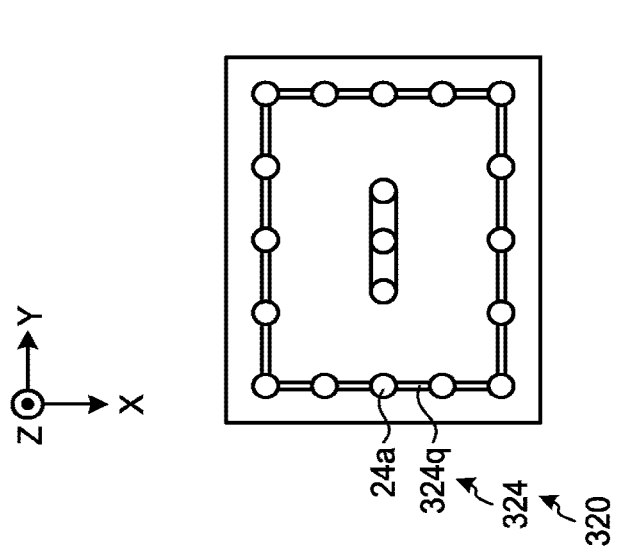

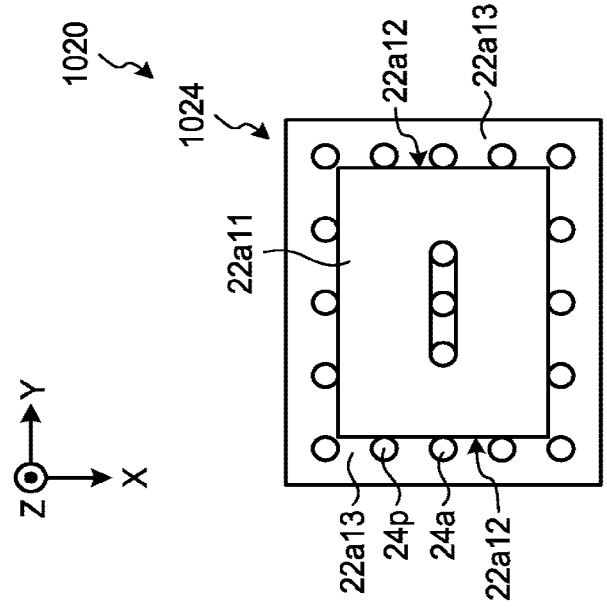
FIG.13A
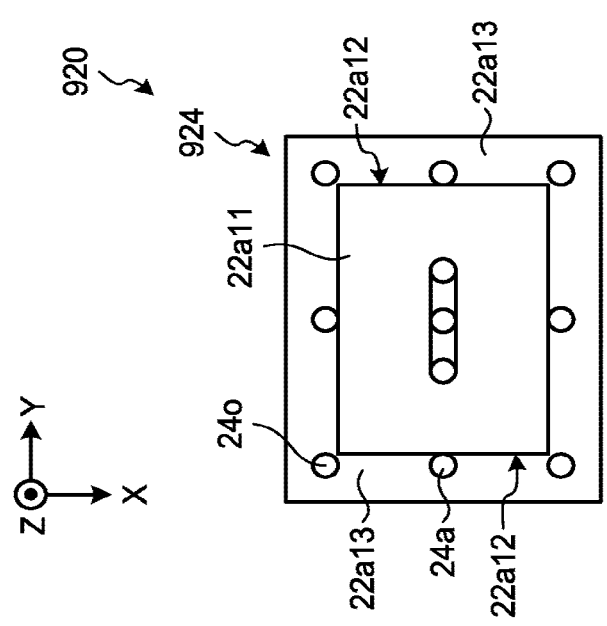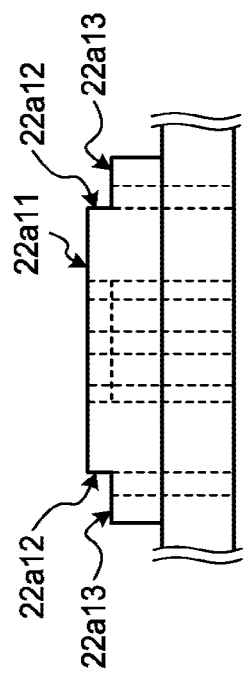
FIG.13B

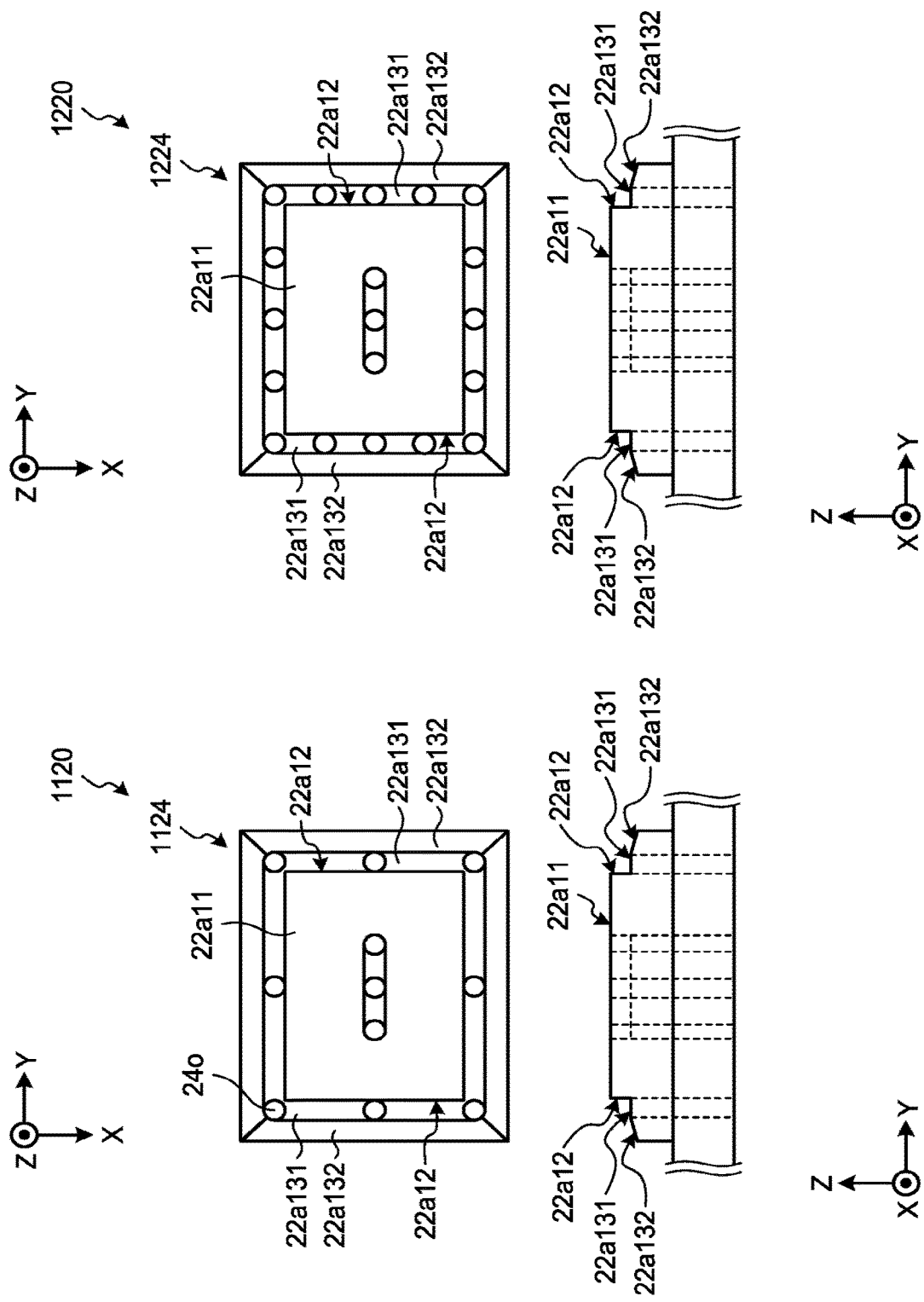

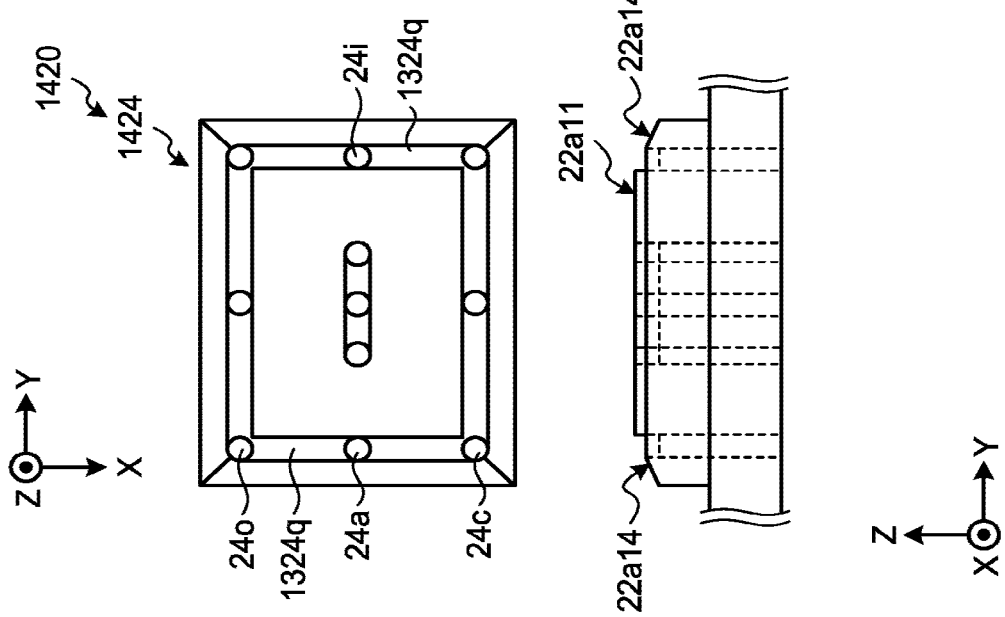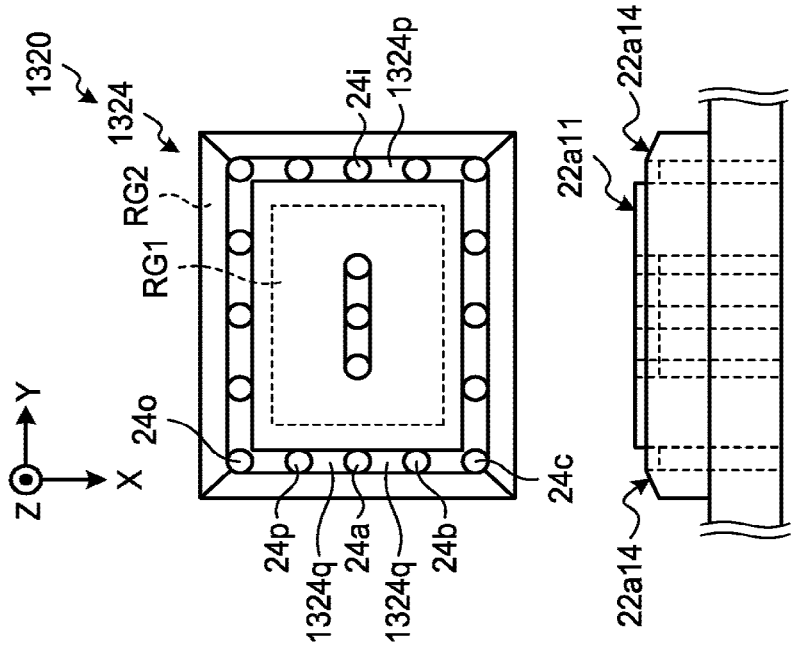

FIG.18A
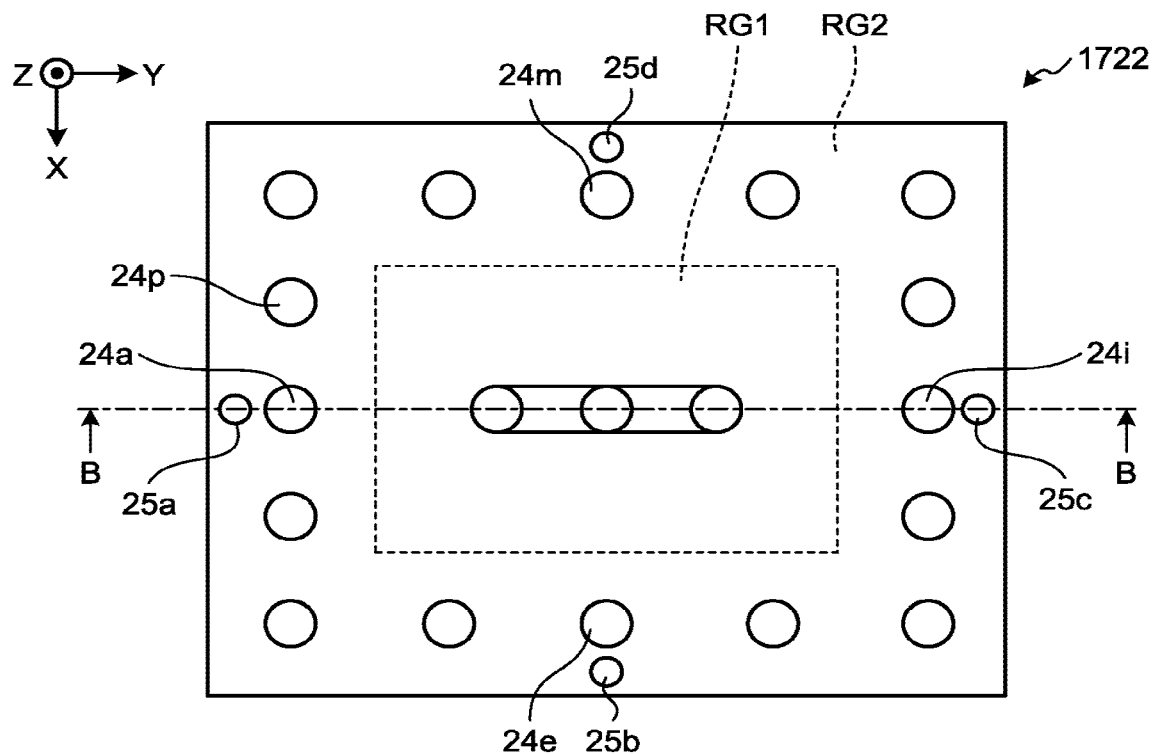
FIG.18B
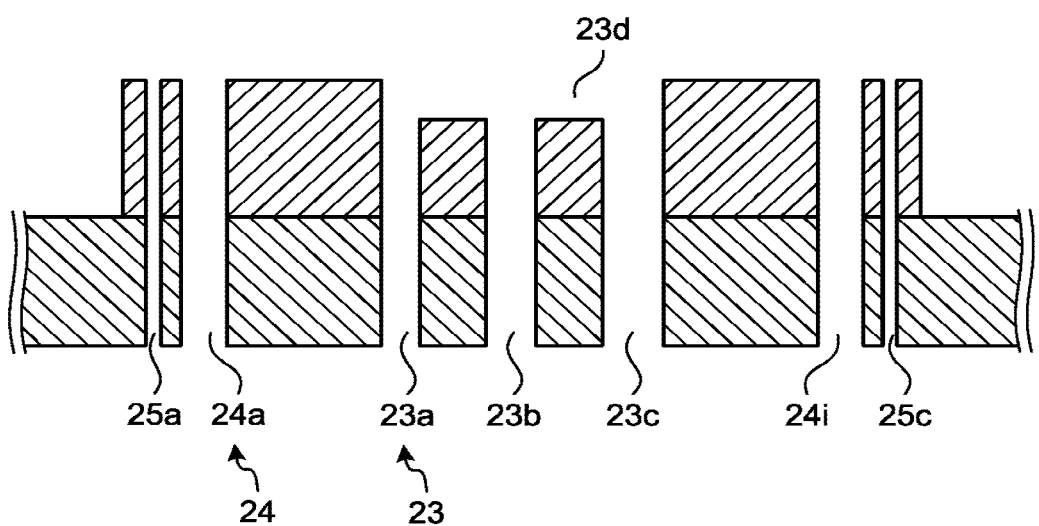
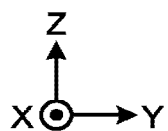

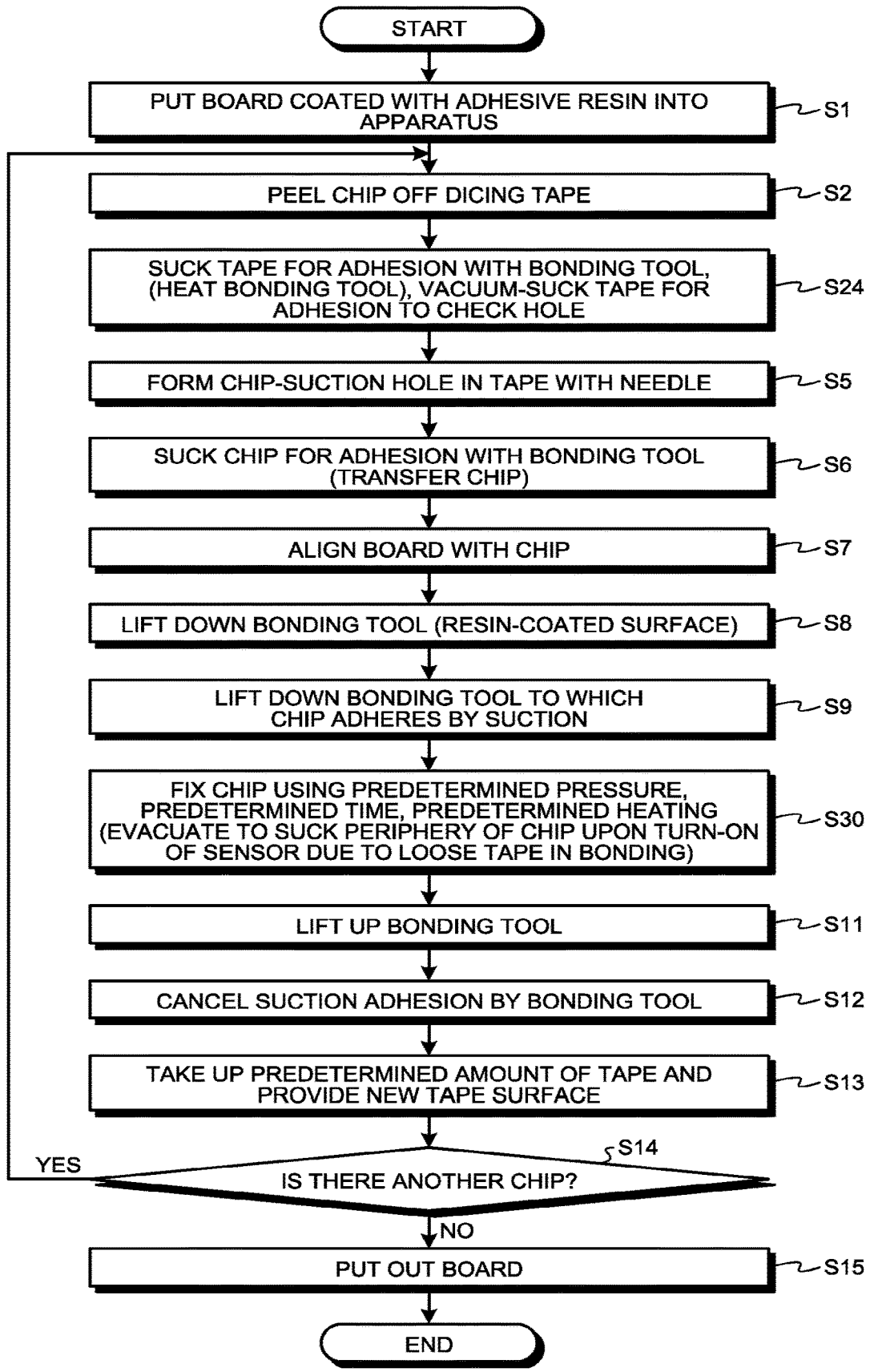

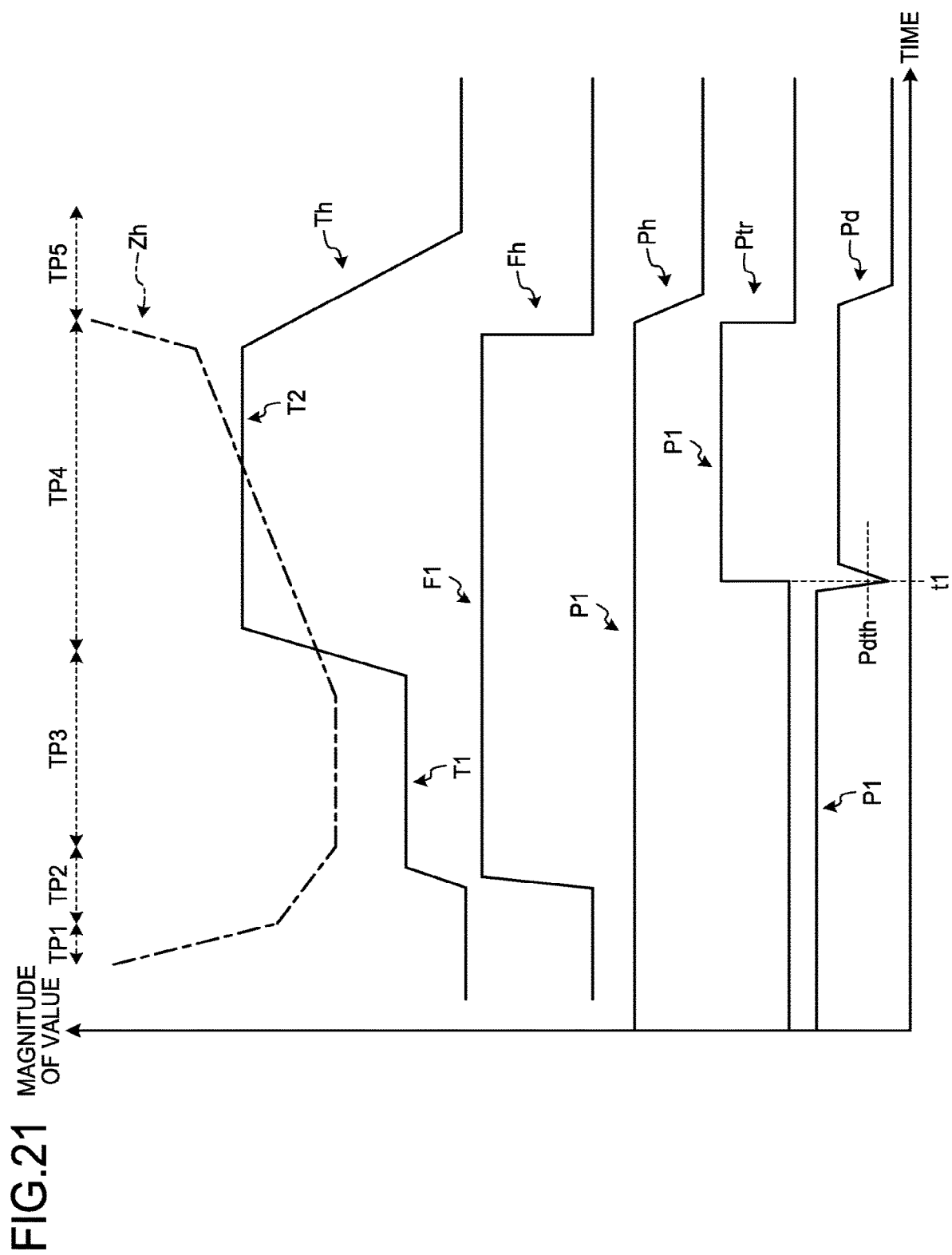

SEMICONDUCTOR MANUFACTURING APPARATUS AND METHOD OF MANUFACTURING SEMICONDUCTOR DEVICE

CROSS-REFERENCE TO RELATED APPLICATIONS

This application is based upon and claims the benefit of priority from Japanese Patent Application No. 2019-168748, filed on Sep. 17, 2019; the entire contents of which are incorporated herein by reference.

FIELD

Embodiments described herein relate generally to a semiconductor manufacturing apparatus and a method of manufacturing a semiconductor device.

BACKGROUND

In a semiconductor manufacturing apparatus that bonds a semiconductor chip, a tape (film) is interposed between a surface of a bonding tool and the semiconductor chip and the bonding tool presses the semiconductor chip via the tape, thereby bonding the semiconductor chip to a board via a plurality of bump electrodes in some cases. In such a case, it is required to perform bonding appropriately.

BRIEF DESCRIPTION OF THE DRAWINGS

FIG. 5 is a flowchart illustrating a method of manufacturing a semiconductor device in the first embodiment;

FIG. 8 is a timing chart illustrating the method of manufacturing a semiconductor device in the first embodiment;

FIGS. 11A to 11C are views illustrating configurations of bonding tools in third to fifth modifications of the first embodiment;

FIGS. 13A and 13B are views illustrating configurations of bonding tools in ninth and tenth modifications of the first embodiment;

FIGS. 14A and 14B are views illustrating configurations of bonding tools in eleventh and twelfth modifications of the first embodiment;

FIGS. 15A and 15B are views illustrating configurations of bonding tools in thirteenth and fourteenth modifications of the first embodiment;

FIGS. 18A and 18B are views illustrating a configuration of a bonding tool in the second embodiment;

FIG. 19 is a flowchart illustrating a method of manufacturing a semiconductor device in the second embodiment;

FIG. 21 is a timing chart illustrating the method of manufacturing a semiconductor device in the second embodiment;

DETAILED DESCRIPTION

Figure 1:
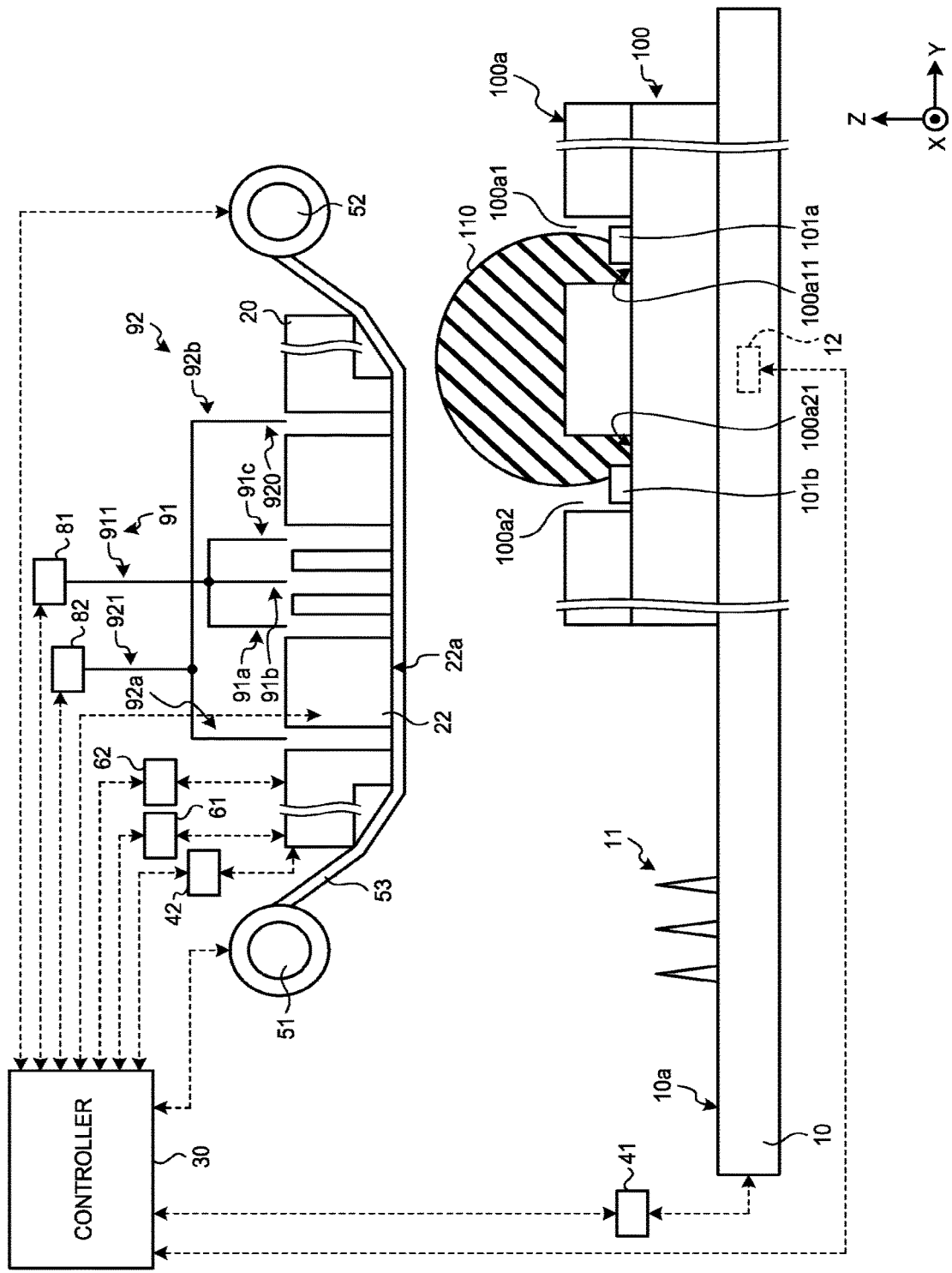
FIG. 1 is a view illustrating a configuration of a semiconductor manufacturing apparatus according to a first embodiment.

In general, according to one embodiment, there is provided a semiconductor manufacturing apparatus including a stage, a bonding tool, and a controller. The stage includes a placement face. The placement face is a face on which a board and a semiconductor chip are placed. The semiconductor chip is a chip to be bonded to the board via a plurality of bump electrodes. The bonding tool includes a front face, a first suction structure and a second suction structure. The front face faces the placement face. The first suction structure is arranged in a first region. The first region overlaps the semiconductor chip in the front face. The second suction structure is provided in a second region. The second region is arranged around the first region in the front face. The controller relatively moves the bonding tool and the stage close to each other while causing the semiconductor chip to adhere by suction to the surface via a tape using at least the first suction structure in a first time period. The controller controls a temperature of the bonding tool to a first target temperature while keeping substantially equal to a target pressure a pressure applied to the semiconductor chip by the bonding tool in a second time period. The second time period is a period following the first time period. The controller controls a relative distance between the bonding tool and the stage so that the pressure applied to the semiconductor chip by the bonding tool is kept substantially equal to the target pressure and also controls the temperature of the bonding tool to a second target temperature in a third time period. The second target temperature is higher than the first target temperature. The third time period is a period following the second time period. The controller relatively moves the bonding tool and the stage away from each other while cancelling suction adhesion by the first suction structure and the second suction structure in a fourth time period. The fourth time period is a period following the third time period.

Exemplary embodiments of a semiconductor manufacturing apparatus will be explained below in detail with reference to the accompanying drawings. The present invention is not limited to the following embodiments.

First Embodiment

A semiconductor manufacturing apparatus according to a first embodiment performs flip-chip mounting in which a semiconductor chip is thermocompression-bonded to a wiring board via a plurality of bump electrodes having clearances therebetween filled with adhesive resin (underfill), thereby forming a semiconductor device. The semiconductor manufacturing apparatus performs film assist bonding (FAB) in which a tape (film) is interposed between a rear surface (a surface opposite to a surface on which a circuit is formed) of a semiconductor chip and a thermocompression bonding tool (hereinafter referred to as a bonding tool). Thus, adhesive resin that extends beyond an outer shape of the chip during thermocompression bonding is prevented from adhering to the bonding tool.

In FAB, a tape interposed between a bonding tool and a semiconductor chip in flip-chip mounting is wrinkled due to heat of the bonding tool in some cases. Adhesive resin that extends beyond the outer shape of the chip flows along the wrinkles of the tape, to overflow and splatter considerably in some cases. Specifically, in flip-chip mounting using FAB, due to wrinkles of the tape, there probably occurs a fillet formed of an overflowing part of adhesive resin (hereinafter referred to as an overflow fillet) around the chip on the board, or a fillet shaped like an island (hereinafter referred to as an island fillet) in a place remote from the chip on the board. Such an overflow fillet or an island fillet occurring in a place remote from a chip is likely to occur in a place where an adhesive resin comes into contact with the board, having flowed along the surface of the board and a tape that is hanging over the board to come into contact with a board. Hence, stable extension of adhesive resin beyond the board is difficult to be obtained, which possibly causes a chip to peel off or causes the adhesive resin to contaminate an adjacent chip or an adjacent component to make the chip or component faulty.

In view of those matters, in this embodiment, the semiconductor manufacturing apparatus controls to a constant pressure a pressure to a chip from a bonding tool provided with a tape suction structure on the outside of a chip suction structure and controls heating operation to the chip from a stage in two steps, so that smooth bonding and thereby reduced wrinkles of a tape can be achieved.

Specifically, a bonding tool responsible for pressurizing a semiconductor chip in flip-chip mounting is provided with a chip suction structure in a region that is to come into contact with a semiconductor chip, and is further provided with a tape suction structure in a region on the outside of the region of the chip suction structure. A bump electrode is bonded to (an electrode pad of) the semiconductor chip. A tape is interposed between the bonding tool and the semiconductor chip and the tape is caused to adhere by suction to the bonding tool using the tape suction structure. Then, a hole communicating with a space in the chip suction structure is formed in the tape, and the semiconductor chip is caused to adhere by suction to the bonding tool through the hole using the chip suction structure. In this state, the bonding tool to which the semiconductor chip adheres by suction is brought close to a board or a stage on which a board locally covered (coated or stuck) with an adhesive agent beforehand in a predetermined region is placed. The bump electrode on the semiconductor chip is brought into contact with wires on the board. Then, the temperature of the bonding tool is controlled to a first target temperature while a pressure applied to the semiconductor chip by the bonding tool is kept substantially equal to a target pressure. Thus, the bump electrode interposed between the semiconductor chip and the wires on the board is moderately deformed, so that an appropriate contact area between the bump electrode and the board may be provided. Thereafter, the temperature of the bonding tool is controlled to a second target temperature higher than the first target temperature while a pressure applied to the semiconductor chip by the bonding tool is kept substantially equal to the target pressure. At that time, the bump electrode may melt with an appropriate contact area between the bump electrode and the board being provided. Thus, elution of the bump electrode toward a peripheral region may be suppressed, which enables smooth bonding between the bump electrode and the board. Further, two-step heating, in addition to the control that keeps an applied pressure substantially equal to the target pressure, can suppress severe deformation of the bump electrode, thereby suppressing abrupt change of a pressure applied to the semiconductor chip by the bonding tool. Thus, a tape may be prevented from being wrinkled. After the temperature of the bonding tool is kept substantially equal to the second target temperature for a predetermined period of time, the semiconductor chip is released from suction adhesion by the chip suction structure. With the chip being released, the bonding tool is moved away from the stage. Thereafter, the tape is released from suction adhesion by the tape suction structure and then the tape is fed. Thus, it is possible to smoothly perform bonding of the semiconductor chip to the board while causing the tape to adhere by suction to the bonding tool using the tape suction structure, thereby suppressing abrupt change of a pressure applied to the semiconductor chip by the bonding tool. As a consequence, wrinkles of the tape in bonding can be reduced, to improve mounting reliability in flip-chip mounting using FAB.

More specifically, a semiconductor manufacturing apparatus 1 is configured as illustrated in FIG. 1. FIG. 1 is a view illustrating a configuration of the semiconductor manufacturing apparatus 1.

The semiconductor manufacturing apparatus 1 includes a stage 10, a bonding tool 20, a controller 30, a drive mechanism 41, a drive mechanism 42, a feed reel 51, a take-up reel 52, a tape 53, a temperature sensor 61, a pressure sensor 62, a pipe system 91, a pipe system 92, a vacuum device 81, and a vacuum device 82. In the following description, a direction perpendicular to a main surface 10a of the stage 10 is defined as Z direction and two directions orthogonal to each other in a plane perpendicular to Z direction are defined as X direction and Y direction.

In the stage 10, a needle unit 11 is provided on a −Y-side region in the surface 10a thereof and a board 100 is placed on a +Y-side region in the surface 10a thereof. Alternatively, the needle unit 11 is not necessarily required to be placed on the stage 10, and the stage 10 and the needle unit may be separate from each other. The board 100 is also called a wiring board or a printed circuit board (PCB). The board 100 has solder resist (SR) holes 100a1 and 100a2 that are positioned so as to correspond to bump electrodes of a semiconductor chip when the board 100 is placed on the surface 10a of the stage 10, in its surface 100a. The surface 100a is a main surface on +Z side in the board 100. In bottom surfaces 100a11 and 100a21 of the holes 100a1 and 100a2, wires 101a and 101b to which bump electrodes of a semiconductor chip are to be bonded are provided. The surface 100a of the board 100, the bottom surfaces 100a11 and 100a21 of the solder resist (SR) holes 100a1 and 100a2 of the board, and the wires 101a and 101b are locally covered with adhesive resin (underfill) 110. The adhesive resin 110 may be either a non-conducting paste (NCP) or a non-conducting film (NCF), for example. In the case of using NCF, the NCF may cover a semiconductor-chip side, that is, a chip surface (the whole surface) on which an electrode of the semiconductor chip has been formed beforehand, instead of locally covering a board side.

The stage 10 has a heating element 12 such as a heater embedded therein. The heating element 12 heats the board 100 via the stage 10 under control of the controller 30.

The bonding tool 20 sucks a semiconductor chip to cause the semiconductor chip to adhere and be fixed thereto. The bonding tool 20 is held by a bonding head (not illustrated) provided on +Z side of the bonding tool 20 through suction adhesion or the like. The bonding tool 20 is larger in size than a semiconductor chip, and is provided with a suction structure that may suck a tape 53 to cause adhesion to a peripheral portion thereof larger in size than the semiconductor chip. When a semiconductor chip that adheres by suction to and is fixed to the bonding tool 20 is bonded to the board 100, the heating element 12 heats the semiconductor chip 200 and the bonding tool 20 via the board 100. Additionally, the heating element may be embedded in the bonding head instead of being embedded in the stage 10. In this case, the heating element heats the semiconductor chip 200 via the bonding tool 20.

Figure 2A:
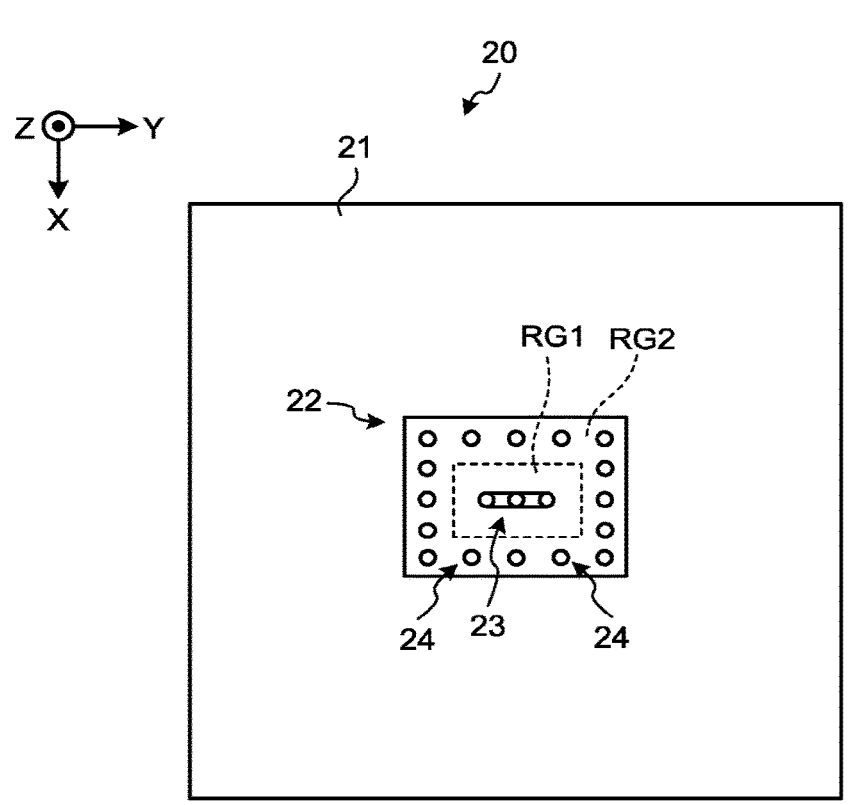
FIGS. 2A to 2C are views illustrating a configuration of a bonding tool in the first embodiment.
Figure 2C:
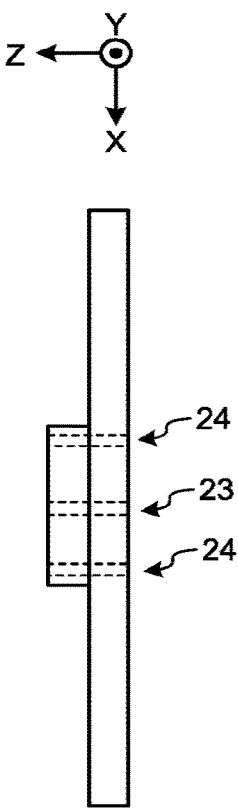
Figure 2B:
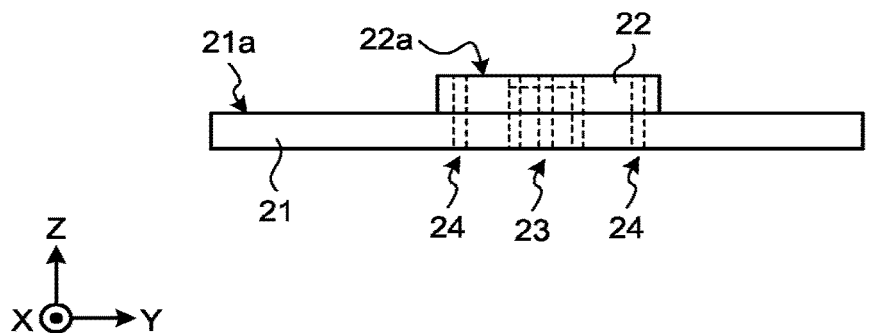

The bonding tool 20 has a configuration illustrated in FIGS. 2A to 2C, for example. FIG. 2A is a plan view illustrating the configuration of the bonding tool, FIG. 2B is a front view illustrating the configuration of the bonding tool, and FIG. 2C is a side view illustrating the configuration of the bonding tool. The bonding tool 20 includes a base 21 and a projection portion 22. The bonding tool 20 may include the base 21 and the projection portion 22 through a cutting process or the like of a single material. In this case, the base 21 and the projection portion 22 form an integral tool.

The base 21 has a shape of a plate extending in X and Y directions. The base 21 may have a substantially rectangular shape in XY plan view. The projection portion 22 is raised in a form of a pedestal on a front face 21a of the base 21. The front face 21a is a main surface on +Z side in the base 21.

The projection portion 22 may be provided in a region including a center of the front face 21a of the base 21 and may be fixed to the front face 21a of the base 21. The projection portion 22 may have a substantially rectangular shape in XY plan view. The projection portion 22 includes a front face 22a, a suction structure (first suction structure) 23, a suction structure (second suction structure) 24. The front face 22a is a main surface on +Z side in the projection portion 22. The front face 22a includes a region RG1 and a region RG2. The region RG1 is a region where the bonding tool 20 is to overlap a semiconductor chip when the semiconductor chip adheres by suction to the bonding tool 20. The region RG2 is a region around the region RG1.

Figure 3A:
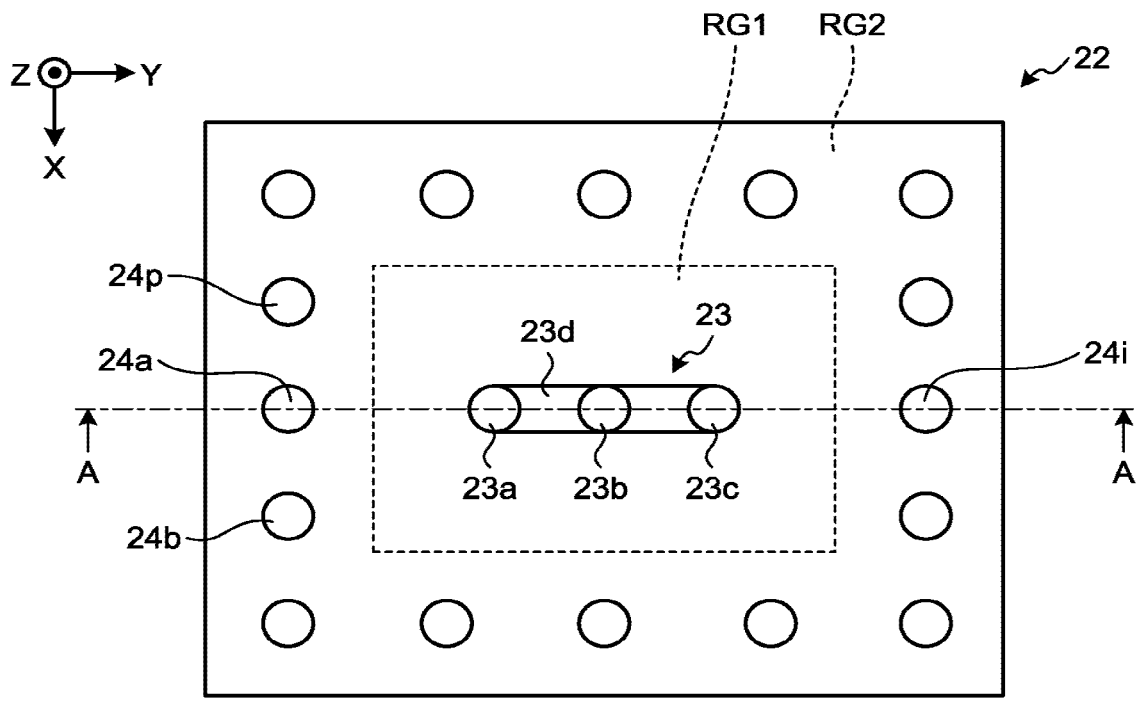
FIGS. 3A and 3B are views illustrating the configuration of the bonding tool in the first embodiment.
Figure 3B:
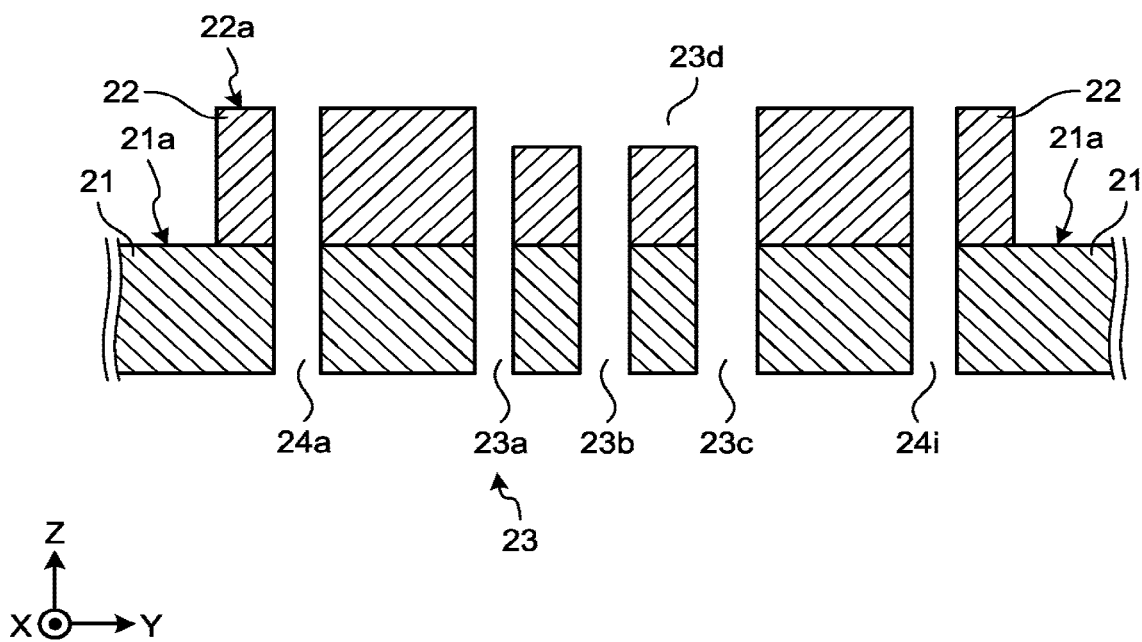

The suction structure 23 is provided in the region RG1. The suction structure 23 sucks a semiconductor chip for adhesion. The suction structure 23 has a configuration illustrated in FIGS. 3A and 3B, for example. FIG. 3A is an enlarged plan view illustrating a configuration of the projection portion in the bonding tool, and FIG. 3B is an enlarged sectional view illustrating the configuration of the projection portion in the bonding tool and illustrates a section taken along a line A-A in the configuration illustrated in FIG. 3A.

The suction structure 23 includes a plurality of suction holes 23a to 23c and a suction groove 23d. Each of the suction holes 23a to 23c extends along Z direction and passes through the projection portion 22 and the base 21. The plurality of suction holes 23a to 23c are arranged along Y direction. The suction groove 23d is provided in the front face 22a of the projection portion 22 and extends along Y direction to connect the plurality of suction holes 23a to 23c on +Z side.

The suction structure 24 is provided in the region RG2. The suction structure 24 sucks a tape present around a semiconductor chip to cause the tape to adhere thereto. The suction structure 24 includes a plurality of suction holes 24a to 24p. Each of the suction holes 24a to 24p extends along Z direction and passes through the projection portion 22 and the base 21. The plurality of suction holes 24a to 24p are arranged so as to surround the region RG1. The plurality of suction holes 24a to 24p are arranged along an outer edge of the region RG1.

The drive mechanism 41 and the drive mechanism 42 illustrated in FIG. 1 may relatively move the stage 10 and the bonding tool 20 in X direction, Y direction, and Z direction under control of the controller 30. For example, the drive mechanism 41 may move the stage 10 in X direction and Y direction under control of the controller 30. The drive mechanism 42 may move the stage 10 also in Z direction under control of the controller 30.

The feed reel 51 is provided on −Y side of the bonding tool 20 so as to be slightly shifted in +Z direction with respect to the bonding tool 20. The take-up reel 52 is provided on +Y side of the bonding tool 20 so as to be slightly shifted in +Z direction with respect to the bonding tool 20. On an end of the projection portion 22 of the bonding tool 20 (on a side where the front face 22a sucking a semiconductor chip for adhesion is provided), there is provided the tape 53, ends of which are wound in reel forms on opposite sides of the bonding head 20, to prevent the adhesive resin 110 from adhering to the front face 22a of the projection portion 22 of the bonding tool 20. In other words, the tape 53 is provided so as to be interposed between the front face 22a of the projection portion 22 of the bonding tool 20 and the adhesive resin 110.

Thus, the tape 53 between the feed reel 51 and the take-up reel 52 is provided so as to come into contact with the front face 22a of the projection portion 22 of the bonding tool 20, so that the tape 53 is placed under tension.

A portion un-used for bonding in the tape 53 is wound around the feed reel 51. The feed reel 51 can feed the tape 53 under control of the controller 30. The take-up reel 52 may take up the tape 53 under control of the controller 30. The take-up reel 52 rotates to take up the tape 53 every time mounting of one semiconductor chip is completed. The tape 53 is interposed between the front face 22a of the projection portion 22 of the bonding tool 20 and a semiconductor chip (refer to FIG. 7A) and prevents the adhesive resin 110 from adhering to the front face 22a of the projection portion 22 of the bonding tool 20 when the semiconductor chip is mounted onto the board 100.

The temperature sensor 61 is provided on a surface that holds the bonding tool 20 in the bonding head. In an alternative case, the temperature sensor 61 is embedded in the bonding tool 20. The temperature sensor 61 senses the temperature of the bonding tool 20 and supplies a sensing result to the controller 30.

The pressure sensor 62 is provided in the bonding tool 20 or the bonding head. The pressure sensor 62 senses a pressure applied to a semiconductor chip by the bonding tool 20 when the bonding tool 20 sucks the semiconductor chip to cause the semiconductor chip to adhere and be fixed thereto. Then, the pressure sensor 62 supplies a sensing result to the controller 30.

The pipe system 91, which operates in association with the suction structure 23, is provided between the suction structure 23 and the vacuum device 81. The pipe system 91 includes a plurality of exhaust pipes 91a to 91c and 911. The exhaust pipes 91a to 91c communicate with spaces in the suction structure 23. The exhaust pipes 91a to 91c communicate with the suction holes 23a to 23c, respectively. The exhaust pipe 911 is provided between the exhaust pipes 91a to 91c and the vacuum device 81.

The vacuum device 81 evacuates spaces in the suction structure 23 via the pipe system 91 under control of the controller 30. The vacuum device 81 exhausts gas having been exhausted from the suction holes 23a to 23c via the exhaust pipes 91a to 91c, via the exhaust pipe 911. The pipe system 91 is provided independently of the pipe system 92. Thus, the vacuum device 81 evacuates spaces in the suction structure 23 via the pipe system 91 without using the pipe system 92.

The pipe system 92, which operates in association with the suction structure 24, is provided between the suction structure 24 and the vacuum device 82. The pipe system 92 includes a plurality of exhaust pipes 92a to 92o and 921. The exhaust pipes 92a to 92o and 921 communicate with spaces in the suction structure 24. The exhaust pipes 92a to 92o communicate with the suction holes 24a to 24p, respectively. The exhaust pipe 921 is provided between the exhaust pipes 92a to 92o and the vacuum device 82.

The vacuum device 82 evacuates spaces in the suction structure 24 via the pipe system 92 under control of the controller 30. The vacuum device 82 exhausts gas having been exhausted from the suction holes 24a to 24p via the exhaust pipes 92a to 92o, via the exhaust pipe 921. The pipe system 92 is provided independently of the pipe system 91. Thus, the vacuum device 82 evacuates spaces in the suction structure 24 via the pipe system 92 without using the pipe system 91. However, if such an independent configuration is difficult to provide for structural reasons of the manufacturing apparatus, the pipe system 92 may be formed so as to join the pipe system 91 and be evacuated by the same vacuum device 81 that evacuates the pipe system 91.

The semiconductor manufacturing apparatus 1 performs flip-chip mounting in which a semiconductor chip (refer to FIG. 7A) is thermocompression-bonded to the board 100 via a plurality of bump electrodes having clearances therebetween filled with the adhesive resin 110, thereby forming a semiconductor device. The semiconductor manufacturing apparatus 1 performs film assist bonding (FAB) in which the tape 53 is interposed between a rear surface of a semiconductor chip and the bonding tool 20.

Figure 4:
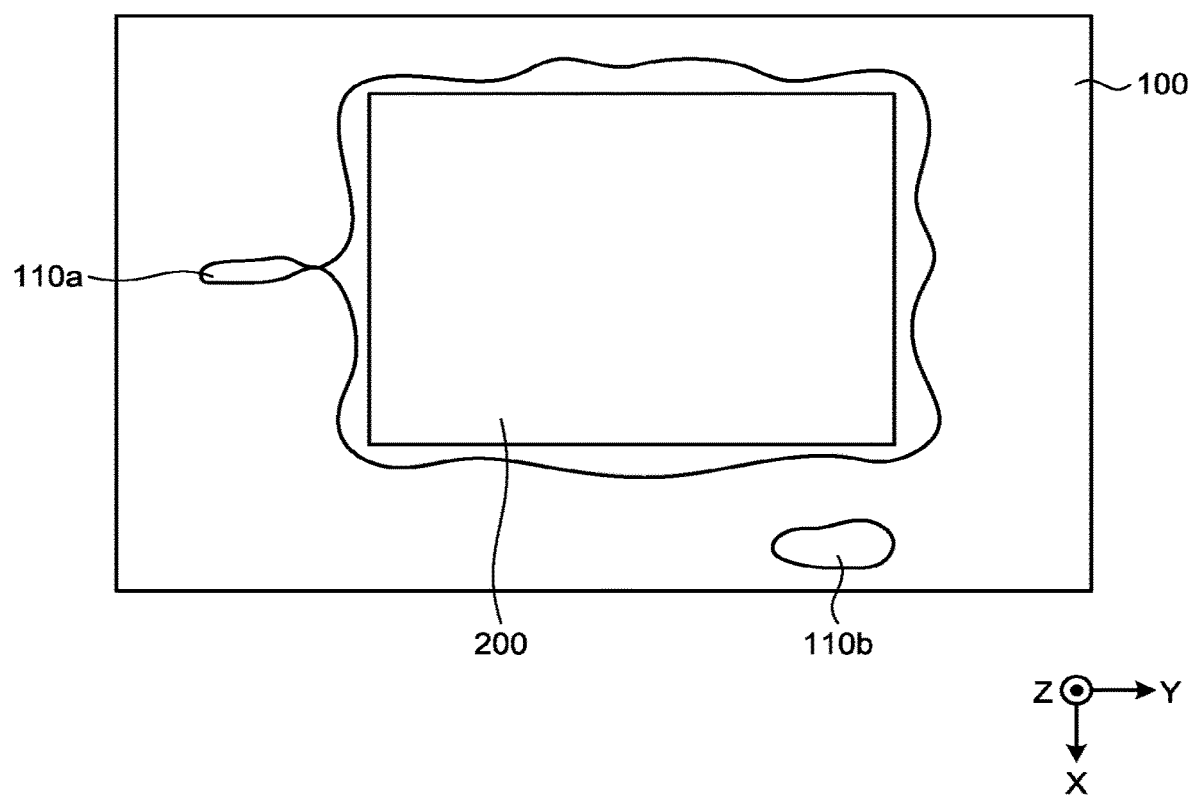
FIG. 4 is a view illustrating a mounted state of a semiconductor device in the first embodiment.

In FAB, the tape 53 interposed between the bonding tool 20 and a semiconductor chip in flip-chip mounting is wrinkled due to heat of the bonding tool 20 in some cases. The adhesive resin 110 that extends beyond the outer shape of the semiconductor chip 200 flows along the wrinkles of the tape 53 (refer to FIG. 1), to overflow and splatter considerably in some cases, as illustrated in FIG. 4. FIG. 4 is a view illustrating a mounted state of a semiconductor device. Specifically, in flip-chip mounting using FAB, due to wrinkles of the tape 53, an overflow fillet 110a or an island fillet 110b of the adhesive resin 110 probably occurs around the semiconductor chip 200 on the board 100. Specifically, the overflow fillet 110a or the island fillet 110b is likely to occur in a place where the adhesive resin 110 comes into contact with the board 100, having flowed along the tape 53 that is hanging over the board 100 to come into contact with the board 100. Thus, stable extension of the adhesive resin 110 beyond the board 100 is difficult to be obtained, which possibly causes the semiconductor chip to peel off the board 100 or causes the adhesive resin 110 to contaminate an adjacent chip or an adjacent component to make the chip or component faulty.

In contrast thereto, in the semiconductor manufacturing apparatus 1, the suction structure 24 is provided in addition to the suction structure 23, so that the tape 53 may adhere by suction to also a portion on the outside of the semiconductor chip 200 (i.e., on the outside of the region RG1), thereby reducing wrinkles of the tape 53. Therefore, mounting reliability in flip-chip mounting using FAB may be improved.

Further, the pipe system 92 for evacuating spaces in the suction structure 24 is separate from the pipe system 91 for evacuating spaces in the suction structure 23. Thus, spaces in the suction structure 24 and spaces in the suction structure 23 may be evacuated independently of each other. Further, the pipe system 92 may be evacuated independently of the pipe system 91 and at a time suitable for suction adhesion of the tape 53. For those reasons and the like, wrinkles of the tape 53 may be reduced.

Figure 6A:
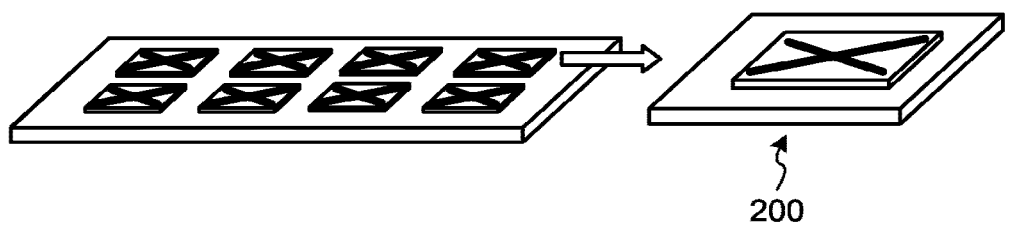
FIGS. 6A to 6C are views illustrating the method of manufacturing a semiconductor device in the first embodiment.

Next, a method of manufacturing a semiconductor device using the semiconductor manufacturing apparatus 1 will be described with reference to FIGS. 5 to 9B. FIG. 5 is a flowchart illustrating the method of manufacturing a semiconductor device. FIG. 6A is a perspective view illustrating the method of manufacturing a semiconductor device, and FIGS. 6B to 7B and FIGS. 9A and 9B are sectional views illustrating respective steps of the method of manufacturing a semiconductor device. FIG. 8 is a timing chart illustrating the method of manufacturing a semiconductor device.

FIG. 6A illustrates the board 100 having been coated with the adhesive resin 110 along predetermined paths beforehand, and FIG. 6A includes an enlarged view of a part thereof. FIG. 6A illustrates an example in which the board 100 including a plurality of rectangular regions respectively corresponding to a plurality of semiconductor chips is coated with the adhesive resin 110 along paths extending along diagonal lines of the rectangular regions. The board 100 is put into the semiconductor manufacturing apparatus 1. The semiconductor manufacturing apparatus 1 is an apparatus for flip-chip mounting of a semiconductor chip. The board 100 put into the semiconductor manufacturing apparatus 1 is conveyed to the stage (thermocompression bonding stage) 10 being heated by the heating element 12 (S1).

A semiconductor wafer is stuck to a dicing tape and is subjected to dicing, so that the semiconductor wafer is divided into individual pieces of plural semiconductor chips. The individual pieces of plural semiconductor chips 200 are peeled off the dicing tape (S2).

Figure 6B:
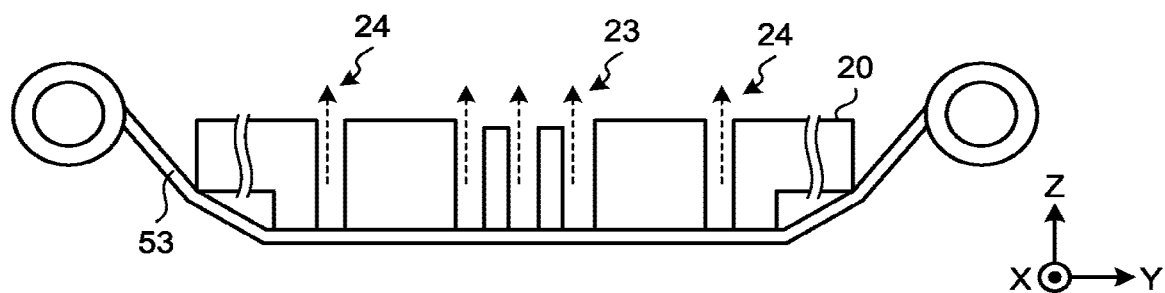
Figure 6C:
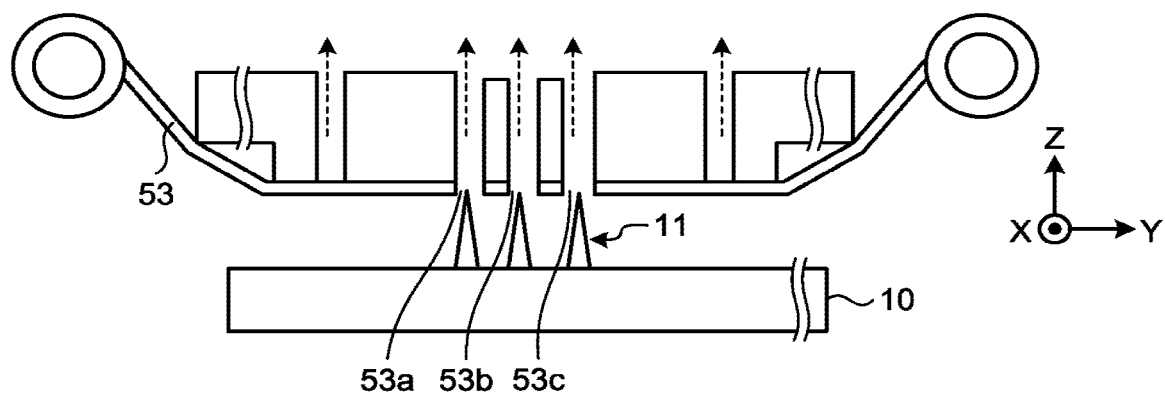
Figure 7A:
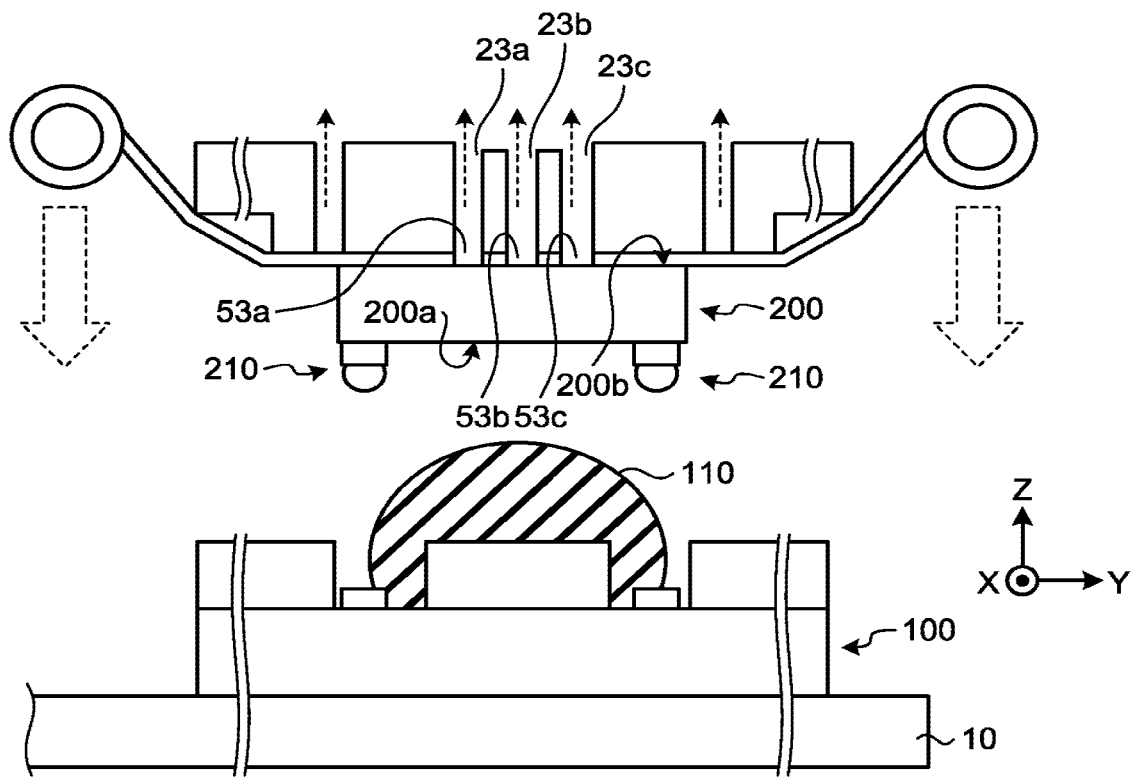
FIGS. 7A and 7B are views illustrating the method of manufacturing a semiconductor device in the first embodiment.

As illustrated in FIG. 6B, the tape 53 is caused to adhere by vacuum suction to the bonding tool 20 using the suction structures 23 and 24 of the bonding tool 20 (S4). In the tape 53 adhering by suction to and being fixed to the bonding tool 20, holes 53a to 53c are formed in predetermined positions using the needle unit (pin) 11 as illustrated in FIG. 6C (S5). Subsequently, each semiconductor chip is transferred from a conveyor system to the bonding tool 20. Then, a rear surface 200b of the semiconductor chip 200 is caused to adhere by vacuum suction to the bonding tool 20 via the holes 53a to 53c of the tape 53 and the suction holes 23a to 23c of the bonding tool 20, to be fixed to the bonding tool 20 as illustrated in FIG. 7A (S6). In the semiconductor chip 200, a front surface 200a is a surface in which a device pattern is formed and the rear surface 200b is a surface opposite to the front surface 200a. In the front surface 200a of the semiconductor chip 200, an electrode pad, which is bonded to a bump electrode 210, is provided.

To perform thermocompression bonding of the semiconductor chip 200 adhering by suction to the bonding tool 20 to the board 100 placed on the stage 10, the board 100 and the semiconductor chip 200 are aligned with each other (S7). Then, the semiconductor chip 200 and the board 100 are thermocompression-bonded to each other in a specified position and under specified conditions (load, temperature, and time).

During thermocompression bonding, the controller 30 monitors an applied pressure (load), the temperature of the bonding tool, a pressure for suction adhesion, and a time in order to achieve operations under previously specified conditions. The controller 30 performs such monitoring in every thermocompression bonding (constantly). Further, the controller 30 achieves thermocompression bonding of the semiconductor chip 200 to the board 100 while alternately enabling and disabling suction adhesion of the tape 53 interposed between the semiconductor chip 200 and the bonding tool 20 using a load (applied pressure), the temperature of the bonding tool, and a pressure for suction adhesion that are previously specified.

For example, the conditions are specified as illustrated in FIG. 8. In FIG. 8, a vertical axis represents a magnitude of a value and a horizontal axis represents a time. In FIG. 8, there are provided examples of a target on-Z-axis position Zh of the drive mechanism 42, a target temperature Th of the bonding tool 20, a target pressure Fh of the bonding tool 20, and a target vacuum degree Ph of the pipe systems 91 and 92. To control the target on-Z-axis position Zh, the controller 30 receives information about an amount of Z-axis travel from the drive mechanism 42 and regulates an amount of Z-axis travel that is to be indicated to the drive mechanism 42 based on the received amount of Z-axis travel. To control the target temperature Th, the controller 30 regulates a heating amount of the heating element 12 based on a temperature sensed by the temperature sensor 61. To control the target pressure Fh, the controller 30 regulates an amount of Z-axis travel of the drive mechanism 42 based on an applied pressure sensed by the pressure sensor 62. In a case where an amount of Z-axis travel of the drive mechanism 42 conforming to the target pressure Fh and an amount of Z-axis travel of the drive mechanism 42 conforming to the target pressure Fh are different from each other, the controller 30 may give a higher priority to an amount of Z-axis travel of the drive mechanism 42 conforming to the target pressure Fh. To control the target vacuum degree Ph, the controller 30 regulates operations of the vacuum devices 81 and 82.

Before a time period TP1 (i.e., at S4), the vacuum devices 81 and 82 are activated and the vacuum degrees of the pipe systems 91 and 92 are controlled to the target vacuum degree Ph=P1 (>0). In other words, the pipe systems 91 and 92 are controlled so that the pipe systems 91 and 92 are decompressed.

In the time period TP1, as indicated by broken-line arrows in FIG. 7A, the bonding tool 20 is lifted down at a high speed in −Z direction (S8), to be brought close to the stage 10 until a bump electrode 210 on −Z side in the semiconductor chip 200 comes into contact with the adhesive resin 110.

Figure 7B:
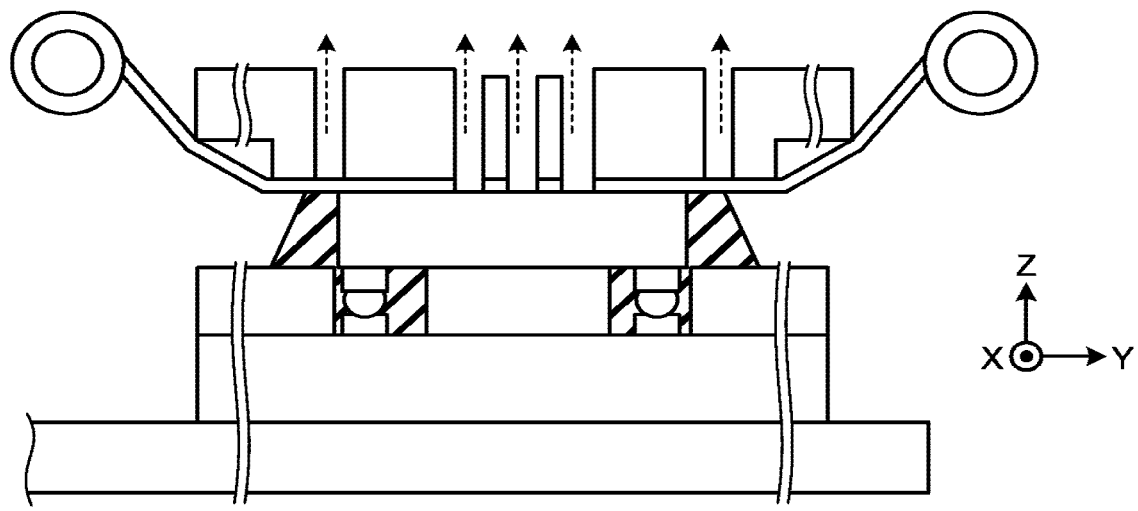

In a time period TP2, when the bump electrode 210 comes into contact with the adhesive resin 110, the speed of lifting down the bonding tool 20 is slightly reduced. Then, the bonding tool 20 is lifted down at the reduced speed in −Z direction (S9). As illustrated in FIG. 7B, the bonding tool 20 is brought close to the stage 10 until the bump electrode 210 on −Z side in the semiconductor chip 200 comes into contact with the bottoms of the holes 100a1 and 100a2 of the board 100.

In a time period TP3, while a pressure applied to the semiconductor chip 200 by the bonding tool 20 is kept substantially equal to the target pressure Fh=F1 illustrated in FIG. 8, the bonding tool 20 is controlled so that the bonding tool 20 has the target temperature Th=T1 illustrated in FIG. 8 (S10).

In a time period TP4, a relative distance between the bonding tool 20 and the stage 10 is controlled so that a pressure applied to the semiconductor chip 200 by the bonding tool 20 is kept substantially equal to the target pressure Fh=F1, and also the temperature of the bonding tool 20 is controlled to the target temperature Th=T2 (>T1) (S10). Specifically, as indicated by broken-line arrows in FIG. 9A, an on-Z-axis position of the bonding head 20 is controlled in +Z direction or −Z direction so that an applied pressure is kept substantially equal to the target pressure Fh=F1. FIG. 8 illustrates an example in which the on-Z-axis position of the bonding head 20 is gradually controlled in +Z direction.

Figure 9A:
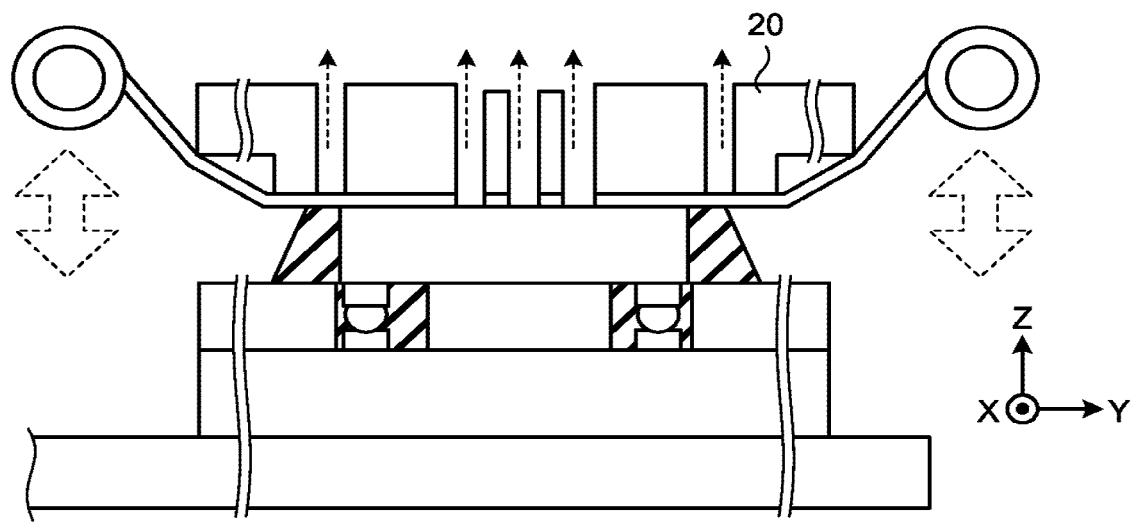
FIGS. 9A and 9B are views illustrating the method of manufacturing a semiconductor device in the first embodiment.
Figure 9B:
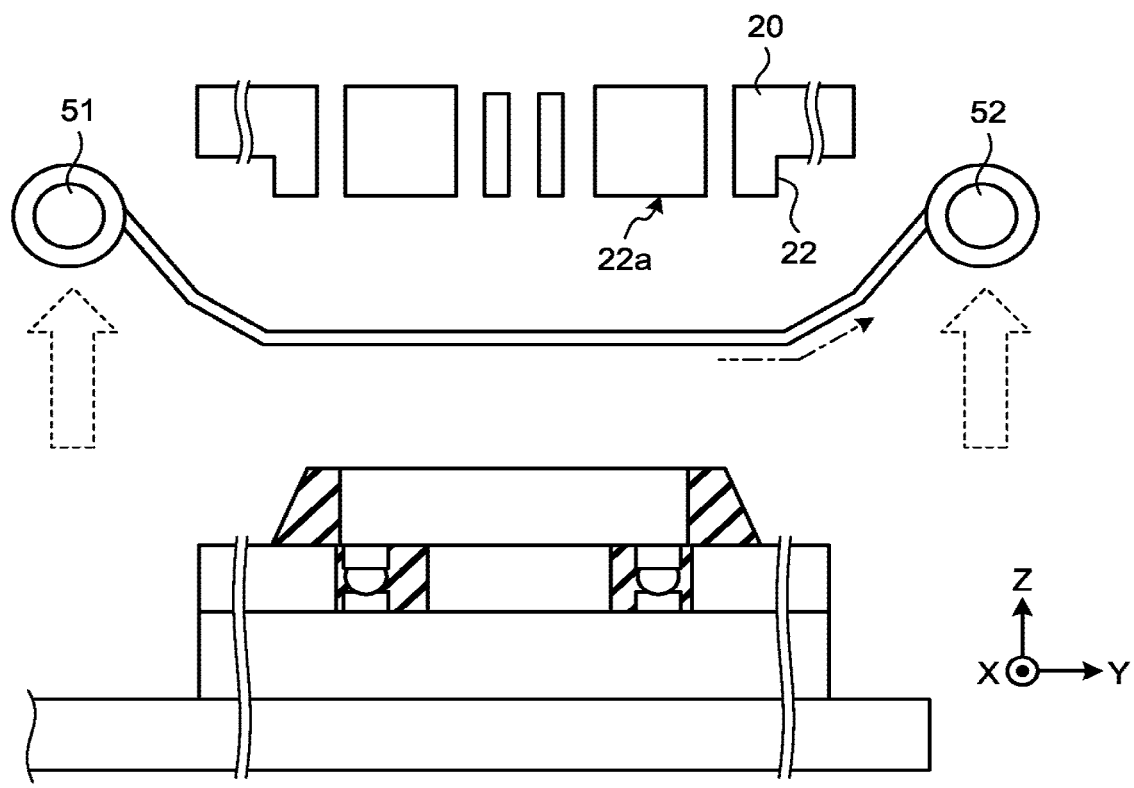

In a time period TP5, as indicated by broken-line arrows in FIG. 9B, the bonding tool 20 in the foregoing state is lifted up in +Z direction (S11), to become away from the stage 10. Suction adhesion by the suction structures 23 and 24 of the bonding head 20 is cancelled (S12). That is, the operations of the vacuum devices 81 and 82 are stopped and the pipe systems 91 and 92 are released from decompression. Then, as indicated by a dash-dotted-line arrow in FIG. 9B, a predetermined amount of the tape 53 is taken up from the feed reel 51 by the take-up reel 52 so that a new portion of the tape 53 is located on −Z side of the front face 22a of the projection portion 22 of the bonding head 20 (S13). Further, the time when suction adhesion by the suction structures 23 and 24 is cancelled after bonding and the time when the bonding head is moved away from the stage can be changed freely depending on a size of a semiconductor chip or the like.

S2 to S13 are repeated until semiconductor chips, the number of which corresponds to the number of semiconductor substrates to be taken (specified number), are processed (Yes at S14). When semiconductor chips, the number of which corresponds to the number of semiconductor substrates to be taken (specified number), are processed and no chip remains un-processed (No at S14), it is determined that thermocompression bonding of all semiconductor chips in a semiconductor substrate is completed. Then, the semiconductor substrate for which thermocompression bonding is completed is put out of the apparatus (S15) and is conveyed to a next step.

As described above, in the embodiment, the semiconductor manufacturing apparatus 1 controls to a constant pressure a pressure to a chip from a bonding tool 20 provided with a tape suction structure 24 on the outside of a chip suction structure 23 and controls heating operation to the chip from the stage 10 in two steps. Thus, bonding operation may be smoothed and thereby wrinkles of the tape 53 may be reduced. As a consequence, stable extension of adhesive resin may be obtained, so that a chip may be prevented from peeling off and an adjacent chip or an adjacent component may be prevented from being contaminated by the adhesive resin.

Figure 10B:
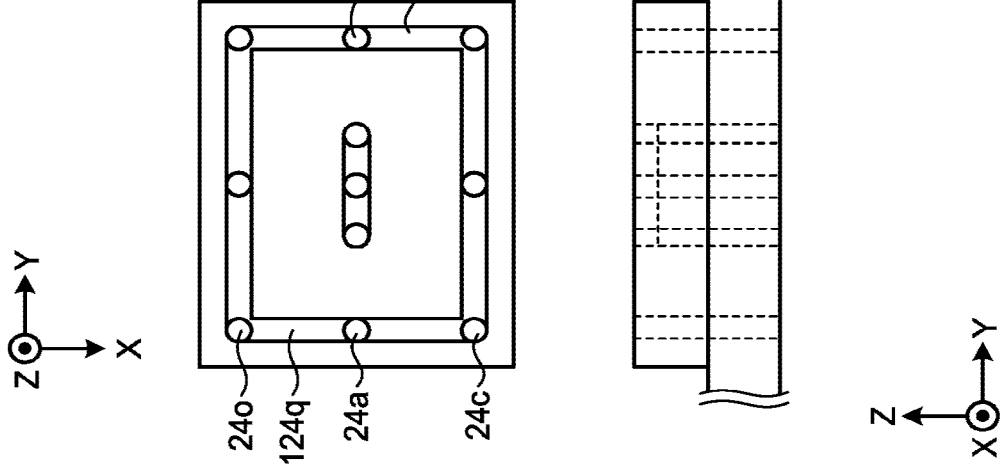
FIGS. 10A and 10B are views illustrating configurations of bonding tools in first and second modifications of the first embodiment.
Figure 10A:
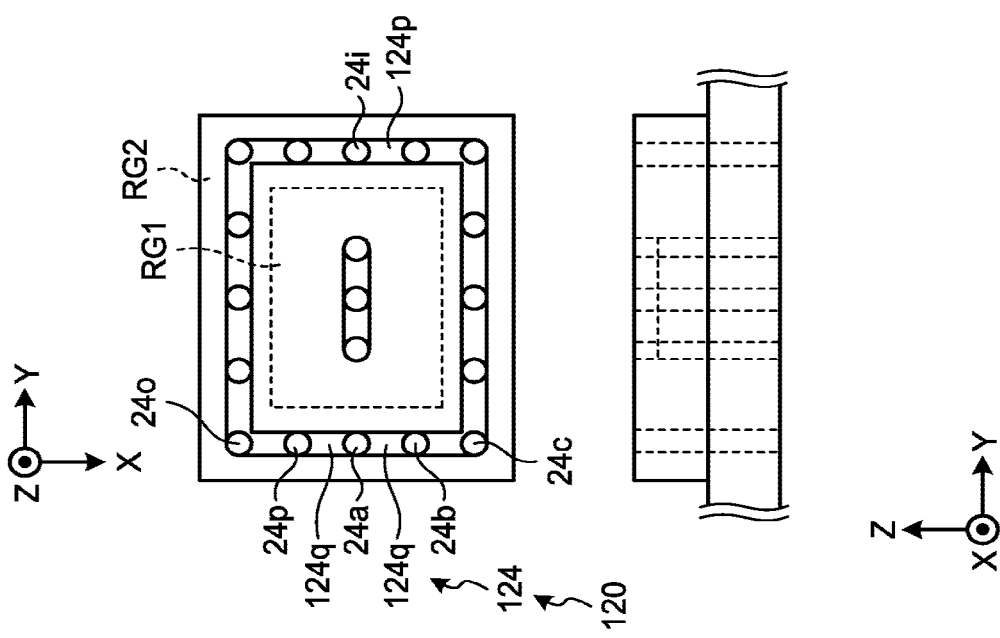

Additionally, a suction structure 124 of a bonding tool 120 may further include a suction groove 124q in addition to the plurality of suction holes 24a to 24p as illustrated in FIG. 10A. FIG. 10A is a view illustrating a configuration of the bonding tool 120 in a first modification of the first embodiment. The suction groove 124q extends along an outer edge of the region RG1. The suction groove 124q may extend so as to surround the region RG1 to connect the plurality of suction holes 24a to 24p. The width of the suction groove 124q is substantially equal to the diameter of each of the suction holes 24a to 24p in XY plan view. This configuration also allows the tape 53 to adhere by suction to a portion on the outside of a semiconductor chip (i.e., on the outside of the region RG1), thereby reducing wrinkles of the tape 53.

Alternatively, a suction structure 224 of a bonding tool 220 may have a configuration that is based on the configuration illustrated in FIG. 10A, but is modified so that the suction holes 24a to 24p are thinned out as illustrated in FIG. 10B. FIG. 10B is a view illustrating a configuration of the bonding tool 220 in a second modification of the first embodiment. FIG. 10B illustrates a configuration in which every other one of the plurality of suction holes 24a to 24p is omitted, as an example. This configuration also allows the tape 53 to adhere by suction to a portion on the outside of a semiconductor chip (i.e., on the outside of the region RG1), thereby reducing wrinkles of the tape 53.

Alternatively, a suction structure 324 of a bonding tool 320 may have a configuration that is based on the configuration illustrated in FIG. 10A, but is modified so that the width of a suction groove 324q is smaller than the diameter of each of the suction holes 24a to 24p as illustrated in FIG. 11A. FIG. 11A is a view illustrating a configuration of the bonding tool 320 in a third modification of the first embodiment. This configuration also allows the tape 53 to adhere by suction to a portion on the outside of a semiconductor chip (i.e., on the outside of the region RG1), thereby reducing wrinkles of the tape 53.

Alternatively, a suction structure 424 of a bonding tool 420 may have a configuration that is based on the configuration illustrated in FIG. 10A, but is modified so that the suction groove 124q is divided into two grooves of suction grooves 424q1 and 424q2 as illustrated in FIG. 11B. FIG. 11B is a view illustrating a configuration of the bonding tool 420 in a fourth modification of the first embodiment. The width of each of the suction grooves 424q1 and 424q2 is substantially equal to the diameter of each of the suction holes 24a to 24p in XY plan view. The suction grooves 424q1 and 424q2 are each substantially U-shaped and have open ends opposite to each other in XY plan view. The suction groove 424q1 extends so as to be substantially U-shaped horizontally to connect the suction holes 24m to 24p and 24a to 24d. The suction groove 424q2 extends so as to be substantially U-shaped horizontally to connect the suction holes 24f to 24l. The suction holes 24e and 24m are each provided between the suction groove 424q1 and the suction groove 424q2. This configuration also allows the tape 53 to adhere by suction to a portion on the outside of a semiconductor chip (i.e., on the outside of the region RG1), thereby reducing wrinkles of the tape 53.

Alternatively, a suction structure 524 of a bonding tool 520 may have a configuration that is based on the configuration illustrated in FIG. 10A, but is modified so that the suction groove 124q is divided into four grooves of suction grooves 524q1 to 524q4 as illustrated in FIG. 11C. FIG. 11C is a view illustrating a configuration of the bonding tool 520 in a fifth modification of the first embodiment. The width of each of the suction grooves 524q1 to 524q4 is substantially equal to the diameter of each of the suction holes 24a to 24p in XY plan view. The suction grooves 524q1 to 524q4 are each substantially L-shaped and have open ends opposite to each other in XY plan view. The suction groove 524q1 extends so as to be substantially L-shaped to connect the suction holes 24b to 24d. The suction groove 524q2 extends so as to be substantially L-shaped to connect the suction holes 24f to 24h. The suction groove 524q3 extends so as to be substantially L-shaped to connect the suction holes 24j to 24l. The suction groove 524q4 extends so as to be substantially L-shaped to connect the suction holes 24n to 24p. The suction holes 24e, 24i, 24m, and 24a are each provided between two of the suction grooves 524q1 to 524q4. This configuration also allows the tape 53 to adhere by suction to a portion on the outside of a semiconductor chip (i.e., on the outside of the region RG1), thereby reducing wrinkles of the tape 53.

Figures 12A, 12B, 12C:
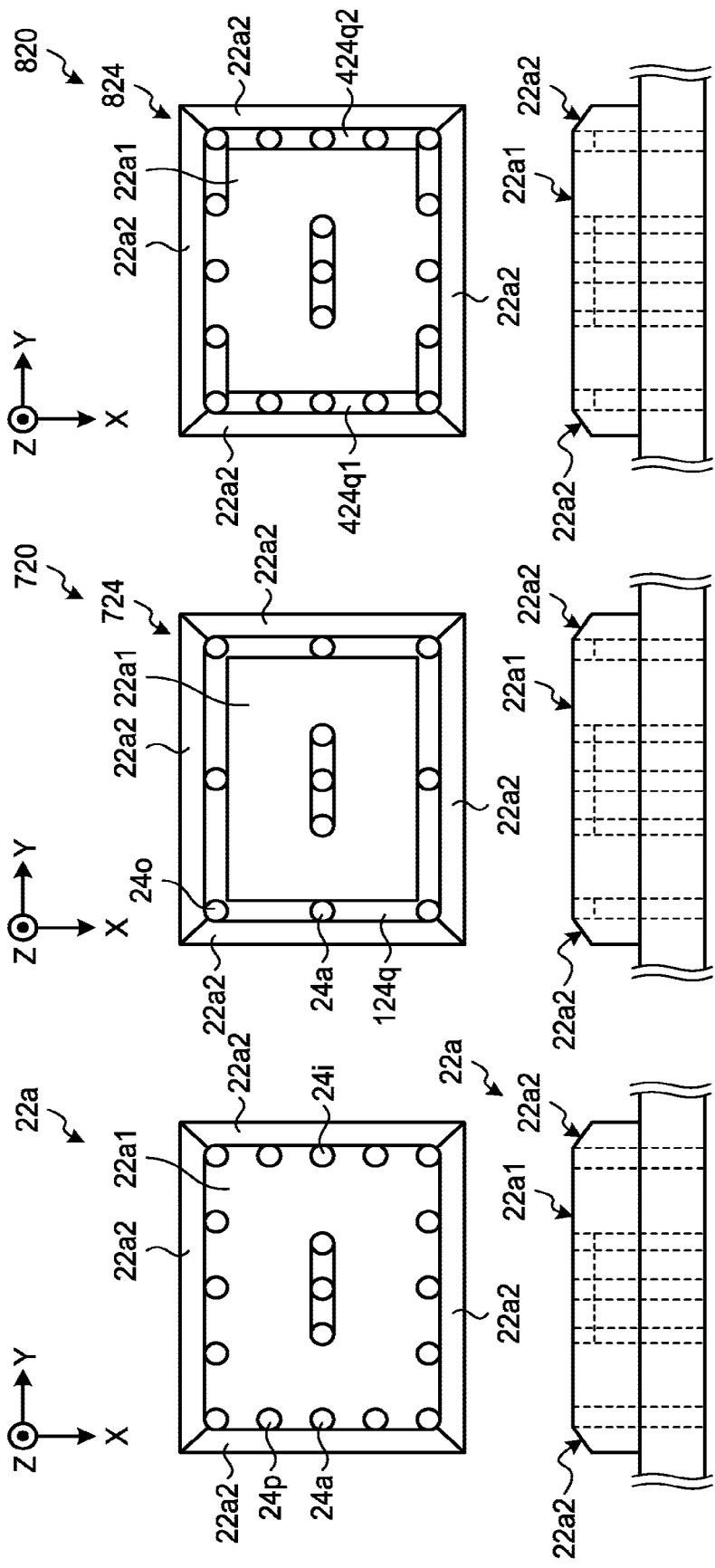
FIGS. 12A to 12C are views illustrating configurations of bonding tools in sixth to eighth modifications of the first embodiment.

Alternatively, a suction structure 624 of a bonding tool 620 may have a configuration that is based on the configuration illustrated in FIGS. 3A and 3B, but is modified so that a portion on the outside of the plurality of suction holes 24a to 24p in the front face 22a has an inclined front face 22a2 as illustrated in FIG. 12A. FIG. 12A is a view illustrating a configuration of the bonding tool 620 in a sixth modification of the first embodiment. Specifically, the front face 22a includes a flat front face 22a1 and the inclined front face 22a2. The inclined front face 22a2 is inclined such that its Z-axis height decreases as a distance from the flat front face 22a1 increases on the outside of the flat front face 22a1. Thus, it is possible to increase a distance to the tape 53 from a portion on the outside of a semiconductor chip during suction adhesion of the tape 53 to the bonding tool 620, which may further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 724 of a bonding tool 720 may have a configuration that is based on the configuration illustrated in FIG. 10B, but is modified so that a portion on the outside of the plurality of suction holes 24a to 24o in the front face 22a has an inclined front face 22a2 as illustrated in FIG. 12B. FIG. 12B is a view illustrating a configuration of the bonding tool 720 in a seventh modification of the first embodiment. Specifically, the front face 22a includes a flat front face 22a1 and the inclined front face 22a2. The inclined front face 22a2 is inclined such that its Z-axis height decreases as a distance from the flat front face 22a1 increases on the outside of the flat front face 22a1. The suction groove 124q extends along a boundary between the flat front face 22a1 and the inclined front face 22a2 in the flat front face 22a1. The plurality of suction holes 24a to 24o are arranged along a boundary between the flat front face 22a1 and the inclined front face 22a2 in the flat front face 22a1. Thus, it is possible to increase a distance to the tape 53 from a portion on the outside of a semiconductor chip during suction adhesion of the tape 53 to the bonding tool 720, which can further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 824 of a bonding tool 820 may have a configuration that is based on the configuration illustrated in FIG. 11B, but is modified so that a portion on the outside of the plurality of suction holes 24a to 24p in the front face 22a has an inclined front face 22a2 as illustrated in FIG. 12C. FIG. 12C is a view illustrating a configuration of the bonding tool 820 in an eighth modification of the first embodiment. Specifically, the front face 22a includes a flat front face 22a1 and the inclined front face 22a2. The inclined front face 22a2 is inclined such that its Z-axis height decreases as a distance from the flat front face 22a1 increases on the outside of the flat front face 22a1. The suction grooves 424q1 and 424q2 extend along a boundary between the flat front face 22a1 and the inclined front face 22a2 in the flat front face 22a1. The plurality of suction holes 24a to 24o are arranged along a boundary between the flat front face 22a1 and the inclined front face 22a2 in the flat front face 22a1. Thus, it is possible to increase a distance to the tape 53 from a portion on the outside of a semiconductor chip during suction adhesion of the tape 53 to the bonding tool 820, which can further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 924 of a bonding tool 920 may have a configuration that is based on the configuration illustrated in FIG. 10B, but is modified so that a portion on the outside of the suction groove 124q is at the same Z-axis height as the bottom surface of the suction groove 124q as illustrated in FIG. 13A. FIG. 13A is a view illustrating a configuration of the bonding tool 920 in a ninth modification of the first embodiment. Specifically, the front face 22a includes a flat front face 22a11, a step face 22a12, and a terrace face 22a13. The terrace face 22a13 is provided on the outside of the flat front face 22a11 and is at a smaller Z-axis height than the flat front face 22a11. The step face 22a12 extends along Z direction to connect an outer edge of the flat front face 22a11 and an inner edge of the terrace face 22a13. The plurality of suction holes 24a to 24o are arranged along a boundary between the flat front face 22a1 and the terrace face 22a13 (in other words, along the step face 22a12) in the terrace face 22a13. Thus, it is possible to increase a distance to the tape 53 from a portion on the outside of a semiconductor chip during suction adhesion of the tape 53 to the bonding tool 920, which can further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 1024 of a bonding tool 1020 may have a configuration that is based on the configuration illustrated in FIG. 10A, but is modified so that a portion on the outside of the suction groove 124q is at the same Z-axis height as the bottom surface of the suction groove 124q as illustrated in FIG. 13B. FIG. 13B is a view illustrating a configuration of the bonding tool 1020 in a tenth modification of the first embodiment. Specifically, the front face 22a includes a flat front face 22a11, a step face 22a12, and a terrace face 22a13. The terrace face 22a13 is provided on the outside of the flat front face 22a11 and is at a smaller Z-axis height than the flat front face 22a11. The step face 22a12 extends along Z direction to connect an outer edge of the flat front face 22a11 and an inner edge of the terrace face 22a13. The plurality of suction holes 24a to 24p are arranged along a boundary between the flat front face 22a1 and the terrace face 22a13 (in other words, along the step face 22a12) in the terrace face 22a13. Thus, it is possible to increase a distance to the tape 53 from a portion on the outside of a semiconductor chip during suction adhesion of the tape 53 to the bonding tool 1020, which may further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 1124 of a bonding tool 1120 may have a configuration that is based on the configuration illustrated in FIG. 13A, but is modified so that a portion on the outside of the plurality of suction holes 24a to 24o in the terrace face 22a13 has an inclined terrace face 22a132 as illustrated in FIG. 14A. FIG. 14A is a view illustrating a configuration of the bonding tool 1120 in an eleventh modification of the first embodiment. Specifically, the terrace face 22a13 includes a flat terrace face 22a131 and the inclined terrace face 22a132. The inclined terrace face 22a132 is inclined such that its Z-axis height decreases as a distance from the flat terrace face 22a131 increases on the outside of the flat terrace face 22a1. The plurality of suction holes 24a to 24o are arranged along a boundary between the flat terrace face 22a131 and the inclined terrace face 22a132 in the flat terrace face 22a131. Thus, it is possible to increase a distance to the tape 53 from a portion on the outside of a semiconductor chip during suction adhesion of the tape 53 to the bonding tool 1120, which may further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 1224 of a bonding tool 1220 may have a configuration that is based on the configuration illustrated in FIG. 13B, but is modified so that a portion on the outside of the plurality of suction holes 24a to 24o in the terrace face 22a13 has an inclined terrace face 22a132 as illustrated in FIG. 14B. FIG. 14B is a view illustrating a configuration of the bonding tool 1220 in a twelfth modification of the first embodiment. Specifically, the terrace face 22a13 includes a flat terrace face 22a131 and the inclined terrace face 22a132. The inclined terrace face 22a132 is inclined such that its Z-axis height decreases as a distance from the flat terrace face 22a131 increases on the outside of the flat terrace face 22a1. The plurality of suction holes 24a to 24o are arranged along a boundary between the flat terrace face 22a131 and the inclined terrace face 22a132 in the flat terrace face 22a131. Thus, it is possible to increase a distance to the tape 53 from a portion on the outside of a semiconductor chip during suction adhesion of the tape 53 to the bonding tool 1220, which may further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 1324 of a bonding tool 1320 may have a configuration that is based on the configuration illustrated in FIG. 10A, but is modified so that a portion on the outside of the region RG1 in the front face 22a has an inclined front face 22a14 and the suction groove 124q is replaced by a suction groove 1324q as illustrated in FIG. 15A. FIG. 15A is a view illustrating a configuration of the bonding tool 1320 in a thirteenth modification of the first embodiment. Specifically, the front face 22a includes a flat front face 22a11 and the inclined front face 22a14. The inclined front face 22a14 is inclined such that its Z-axis height decreases as a distance from the flat front face 22a11 increases on the outside of the flat front face 22a11. An open end of the suction groove 1324q is located on the inclined front face 22a14 and the on-Z-axis position thereof may be lower than the on-Z-axis position of the flat front face 22a11. The suction groove 1324q may extend so as to surround the region RG1 to connect the plurality of suction holes 24a to 24p. Thus, it is possible to increase a distance to the tape 53 from a portion on the outside of a semiconductor chip during suction adhesion of the tape 53 to the bonding tool 1320, which may further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Alternatively, a suction structure 1424 of a bonding tool 1420 may have a configuration that is based on the configuration illustrated in FIG. 15A, but is modified so that the suction holes 24a to 24p are thinned out as illustrated in FIG. 15B. FIG. 15B is a view illustrating a configuration of the bonding tool 1420 in a fourteenth modification of the first embodiment. FIG. 15B illustrates a configuration in which every other one of the plurality of suction holes 24a to 24p is omitted, as an example. This configuration also may increase a distance to the tape 53 from a portion on the outside of a semiconductor chip during suction adhesion of the tape 53 to the bonding tool 11420, which may further suppress adhesion of the adhesive resin 110 to the tape 53. Further, this configuration also allows the tape 53 to adhere by suction to a portion on the outside of a semiconductor chip (i.e., on the outside of the region RG1), thereby reducing wrinkles of the tape 53.

Figure 16B:
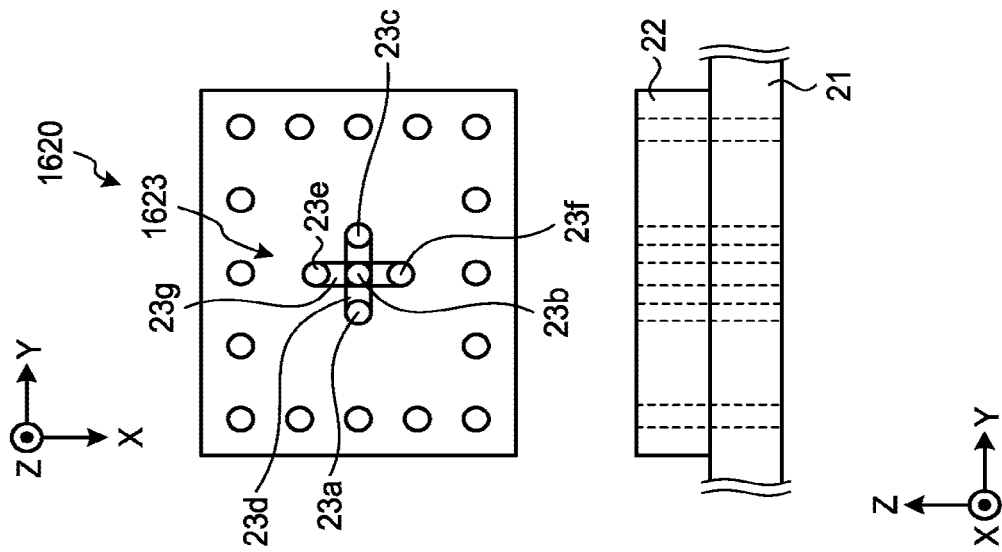
FIGS. 16A and 16B are views illustrating configurations of bonding tools in fifteenth and sixteenth modifications of the first embodiment.
Figure 16A:
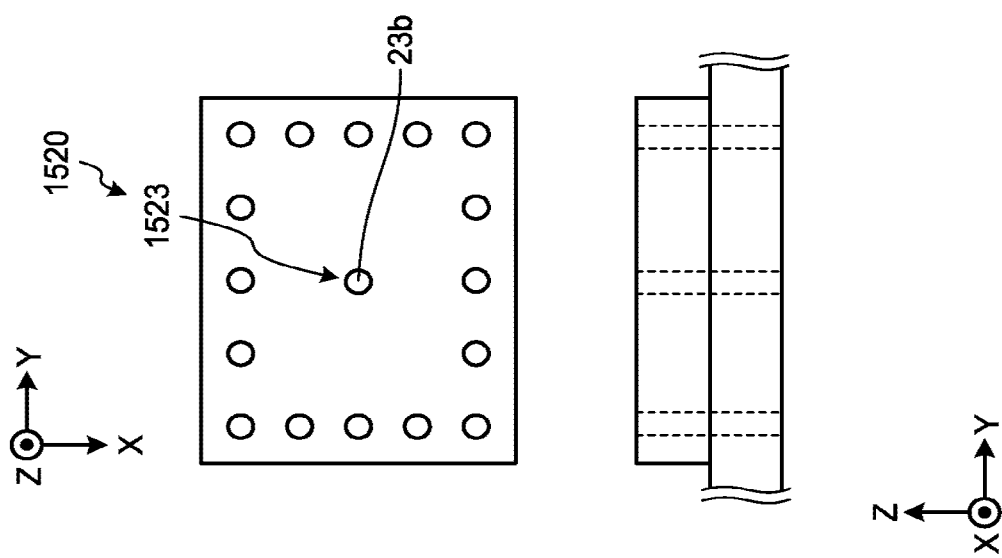

Alternatively, a suction structure 1523 of a bonding tool 1520 may have a configuration that is based on the configuration illustrated in FIGS. 3A and 3B, but is modified so that there is provided a single suction hole for a chip as illustrated in FIG. 16A. FIG. 16A is a view illustrating a configuration of the bonding tool 1520 in a fifteenth modification of the first embodiment. Specifically, the suction structure 1523 is based on the suction structure 23, but is modified so that the suction holes 23a and 23c and the suction groove 23d are omitted. Thus, the suction structure 1523 may be simplified, which reduces cost for the bonding tool 1520. Further, this configuration also enables suction adhesion of a semiconductor chip using the bonding tool 1520.

Alternatively, a suction structure 1423 of a bonding tool 1620 may have a configuration that is based on the configuration illustrated in FIGS. 3A and 3B, but is modified so that another suction hole for a chip and another suction groove are added as illustrated in FIG. 16B. FIG. 16B is a view illustrating a configuration of the bonding tool 1620 in a sixteenth modification of the first embodiment. Specifically, the suction structure 1423 is based on the suction structure 23, but is modified so that suction holes 23e and 23f and a suction groove 23g are added. Each of the suction holes 23e and 23f extends along Z direction and passes through the projection portionprojection portion 22 and the base 21. The plurality of suction holes 23e, 23b, and 23f are arranged along X direction. The suction groove 23g is provided in the front face 22a of the projection portionprojection portion 22 and extends along X direction to connect the plurality of suction holes 23e, 23b, and 23f on +Z side. The suction groove 23d and the suction groove 23g cross each other to be substantially cross-shaped in XY plan view. Thus, the suction-adhesion capability of the suction structure 1623 may be further improved. Further, this configuration also enables suction adhesion of a semiconductor chip using the bonding tool 1620.

Second Embodiment

Next, a semiconductor manufacturing apparatus according to a second embodiment will be described. Below, differences from the first embodiment will be mainly described.

According to the second embodiment, in a semiconductor manufacturing apparatus 1701, a check hole for monitoring a wrinkle of a tape is formed in a bonding tool. Thus, the semiconductor manufacturing apparatus 1701 is provided with a monitoring function of reading out occurrence of a wrinkle in the tape 53 during thermocompression bonding by referring to reduction of the vacuum degree of the check hole. Then, the semiconductor manufacturing apparatus 1501 produces vacuum for suction adhesion of a tape upon occurrence of a wrinkle in a tape, to cause the tape around a chip to adhere by suction, and performs thermocompression bonding of the chip to a board.

Figure 17:
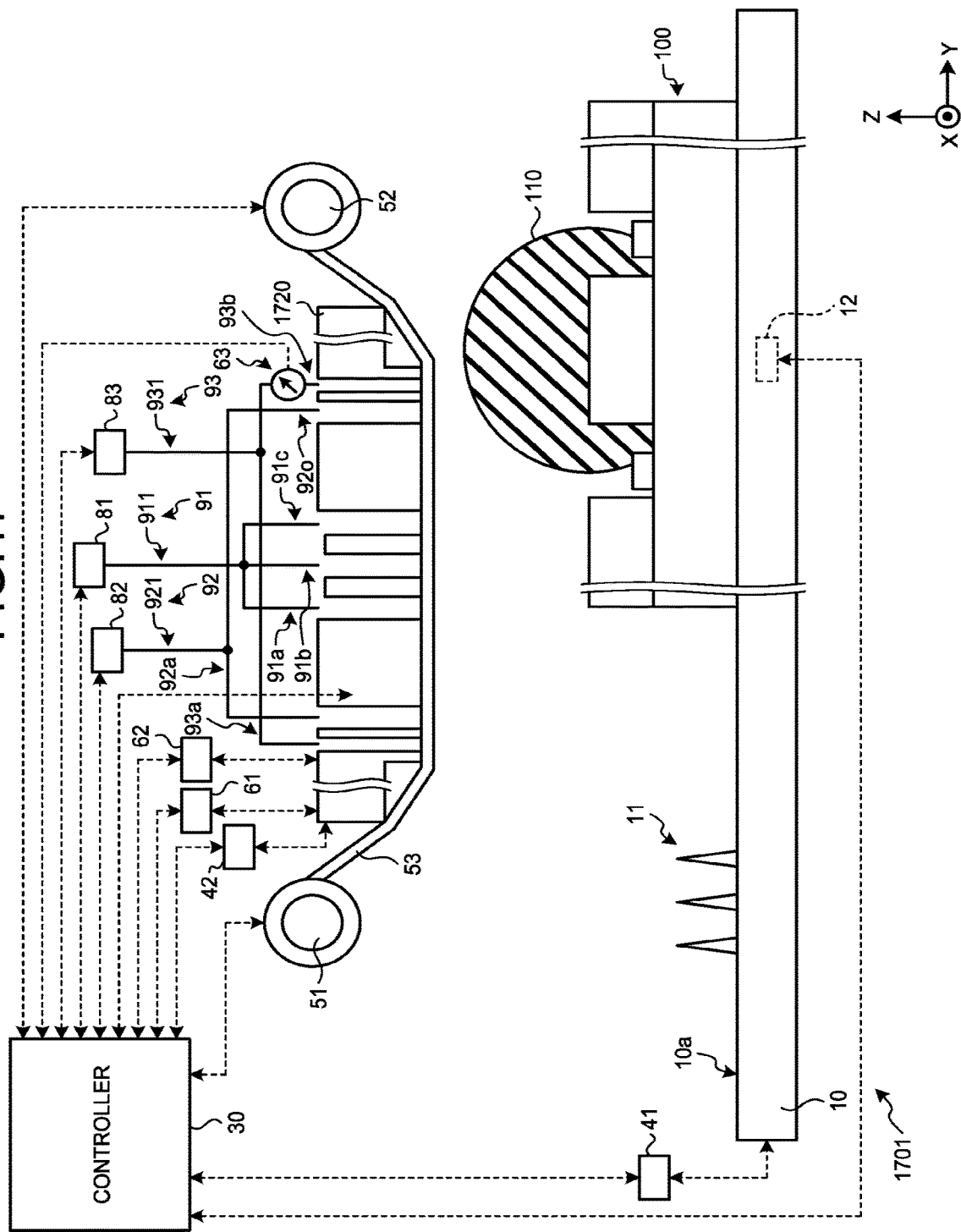
FIG. 17 is a view illustrating a configuration of a semiconductor manufacturing apparatus in a second embodiment.

Specifically, the semiconductor manufacturing apparatus 1701 includes a bonding tool 1720 in place of the bonding tool 20 (refer to FIG. 1), a suction sensor 63, a pipe system 93, and a vacuum device 83 as illustrated in FIG. 17.

The bonding tool 1720 has a configuration illustrated in FIGS. 18A and 18B, for example. FIG. 18A is an enlarged plan view illustrating a configuration of a projection portion 1722 of the bonding tool 1720. FIG. 18B is an enlarged sectional view illustrating the configuration of the projection portion 1722 of the bonding tool 1720 and illustrates a section taken along a line B-B in the configuration illustrated in FIG. 18A. The bonding tool 1720 includes the projection portion 1722 in place of the projection portion 22 (refer to FIG. 3). The projection portion 1722 further includes a plurality of check holes 25a to 25d. The check holes 25a to 25d are provided near the suction structure 24. The check hole 25a is provided near the suction hole 24a. The check hole 25b is provided near the suction hole 24e. The check hole 25c is provided near the suction hole 24i. The check hole 25d is provided near the suction hole 24m. FIGS. 18A and 18B illustrate a configuration in which the check holes 25a to 25d are provided on the outside of the plurality of suction holes 24a to 24p in XY plan view, as an example. The bonding tool 1720 may include the base 21 and the projection portion 1722 through a cutting process or the like of a single material. In this case, the base 21 and the projection portion 1722 form an integral tool.

The pipe system 93 illustrated in FIG. 17, which operates in association with the check holes 25a to 25d, is provided between the check holes 25a to 25d and the vacuum device 83. The pipe system 93 includes a plurality of exhaust pipes 93a to 93d and 931. The exhaust pipes 93a to 93d communicate with the check holes 25a to 25d, respectively. The exhaust pipe 931 is provided between the exhaust pipes 93a to 93d and the vacuum device 83.

The vacuum device 83 evacuates the check holes 25a to 25d via the pipe system 93 under control of the controller 30. The pipe system 93 is provided independently of the pipe system 91 and the pipe system 92. Thus, the vacuum device 83 evacuates the check holes 25a to 25d via the pipe system 93 without using the pipe system 91 or the pipe system 92.

The suction sensor 63 is provided at some midpoint in the pipe system 93. FIG. 17 illustrates a configuration in which the suction sensor 63 is provided at some midpoint in the exhaust pipe 93b, as an example. The suction sensor 63 senses a pressure of gas passing through the pipe system 93 and supplies a sensing result to the controller 30. A sensed result of the suction sensor 63 indicates the vacuum degree of the pipe system 93. Specifically, a low pressure of gas passing through the pipe system 93 indicates a high vacuum degree and a high pressure of gas passing through the pipe system 93 indicates a low vacuum degree.

Meanwhile, a method of manufacturing a semiconductor device using the semiconductor manufacturing apparatus 1701 is different from that in the first embodiment in the following respects as illustrated in FIGS. 19 to 23. FIG. 19 is a flowchart illustrating the method of manufacturing a semiconductor device. FIGS. 20 and 22A to 23B are sectional views illustrating respective steps in the method of manufacturing a semiconductor device. FIG. 21 is a timing chart illustrating the method of manufacturing a semiconductor device.

Figure 20:
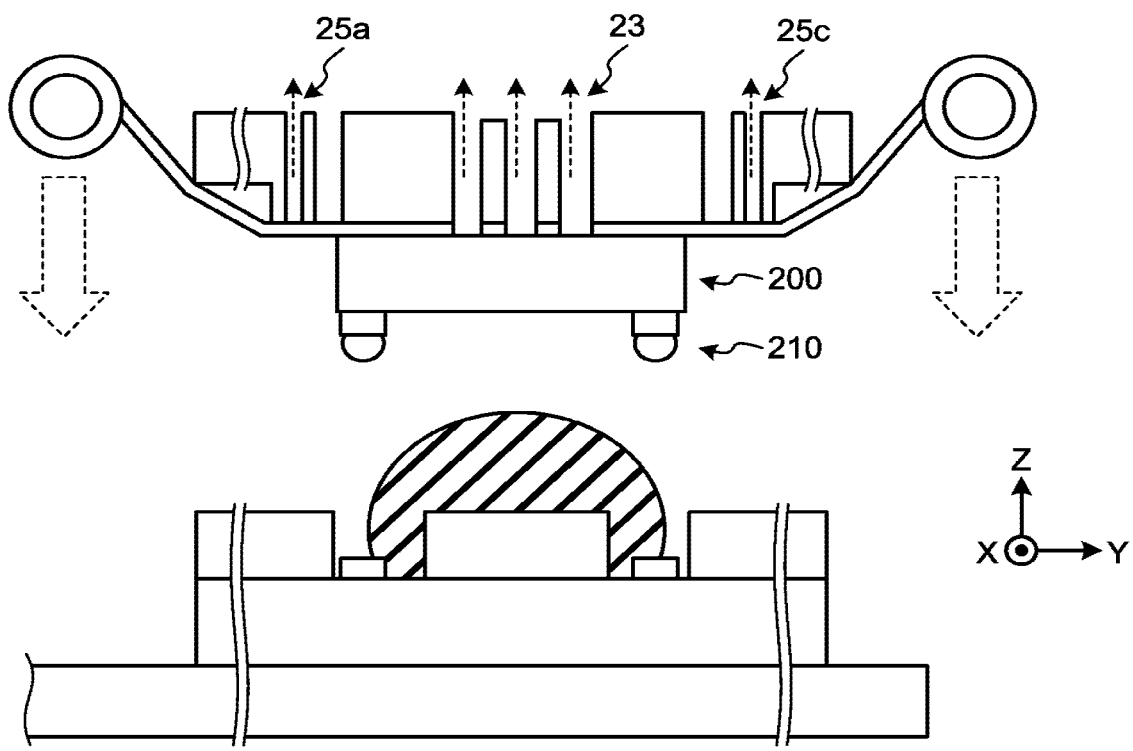
FIG. 20 is a view illustrating the method of manufacturing a semiconductor device in the second embodiment.

After S1 and S2, the controller 30 activates the vacuum devices 81 and 83 and does not activate the vacuum device 82. As illustrated in FIG. 20, whereas suction adhesion by the suction structure 23 (the plurality of suction holes 24a to 24p) and suction adhesion by the check holes 25a to 25d are performed (S24), suction adhesion by the suction structure 24 is not yet performed.

Figure 22A:
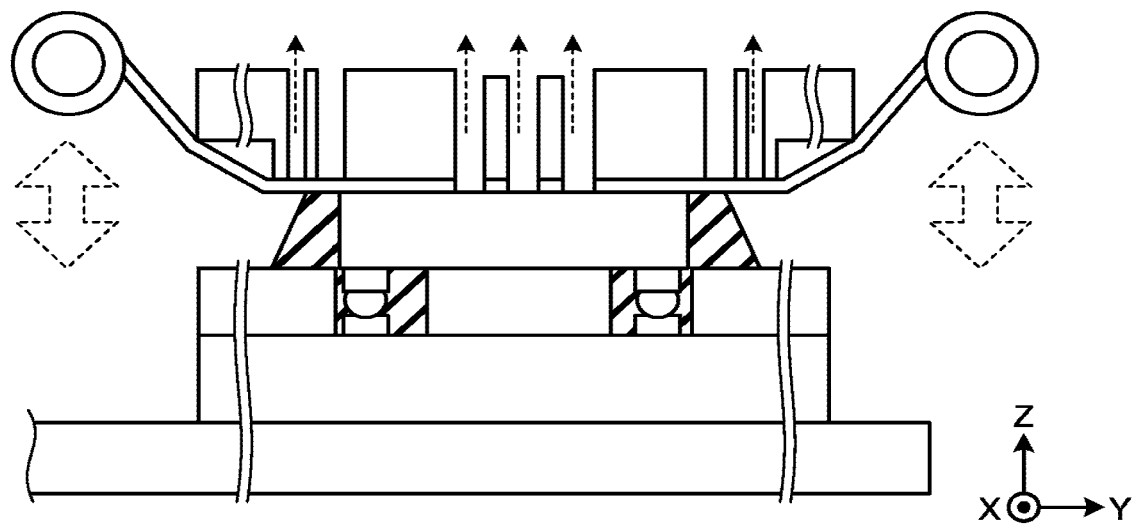
FIGS. 22A and 22B are views illustrating the method of manufacturing a semiconductor device in the second embodiment.

For example, before a time period TP1 in FIG. 21 (i.e., at S24), the vacuum devices 81 and 83 are activated and the vacuum degrees of the pipe systems 91 and 93 are controlled to target vacuum degrees Ph=P1 (>0) and Pd=P1 (>0), as illustrated in FIG. 22A. In other words, the pipe systems 91 and 93 are controlled so that the systems are decompressed. As the vacuum device 82 is not activated, the vacuum degree of the pipe system 92 is controlled to a target vacuum degree Ptr≈0.

Figure 22B:
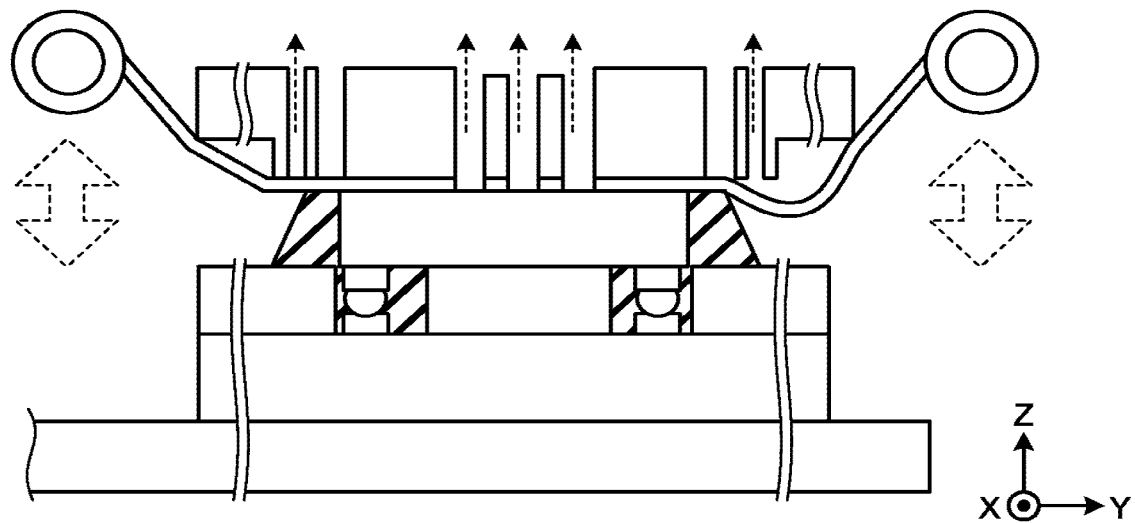
Figure 23A:
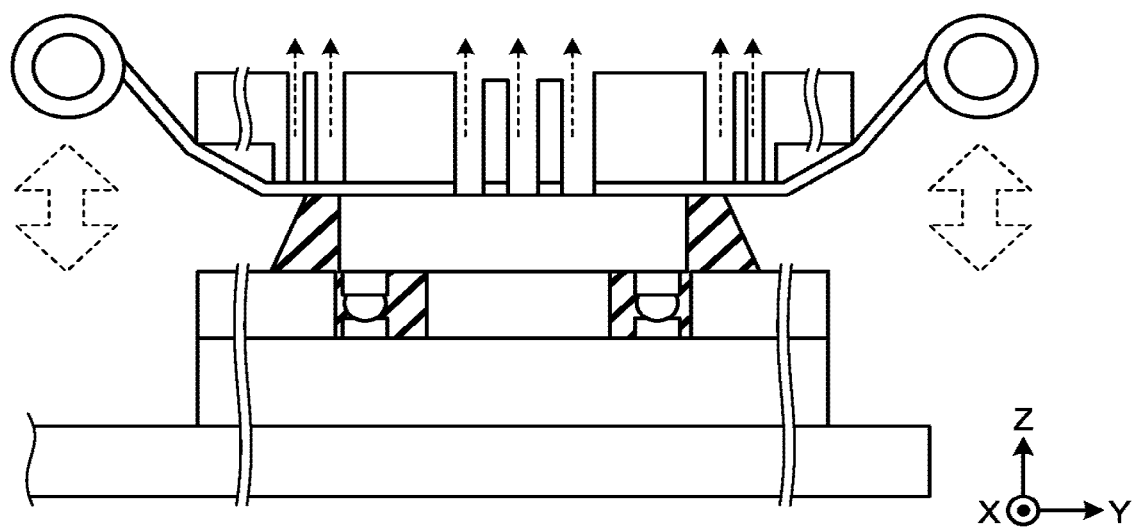
FIGS. 23A and 23B are views illustrating the method of manufacturing a semiconductor device in the second embodiment.
Figure 23B:
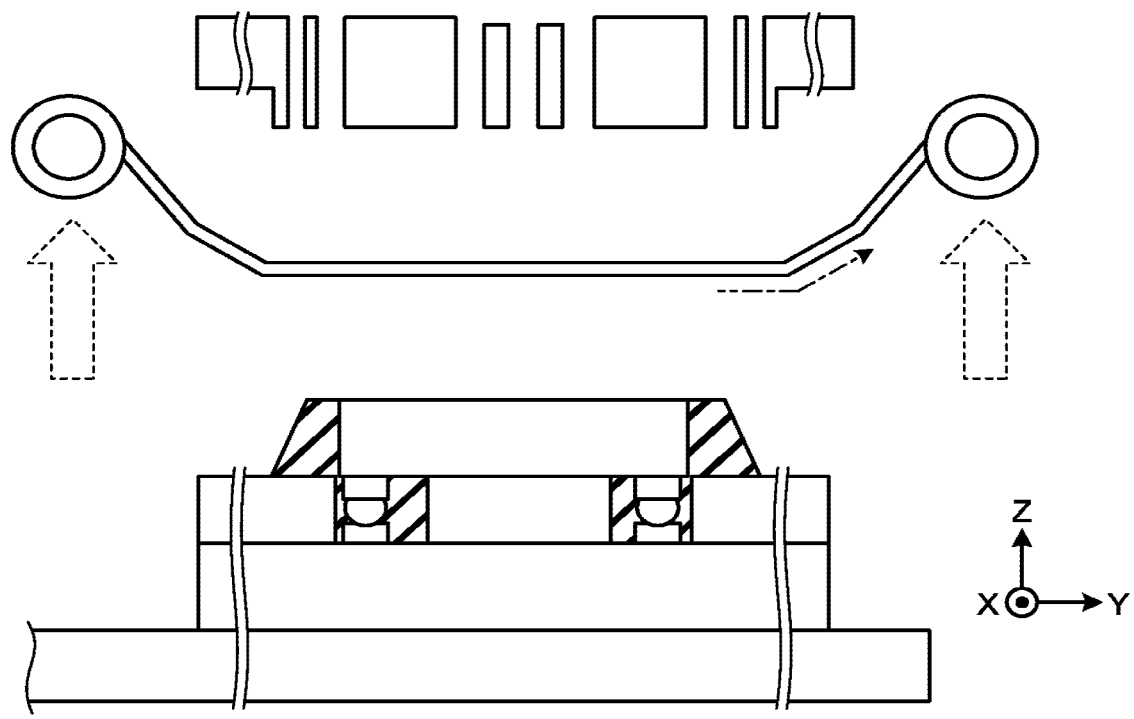

Subsequently, after S5 to S9, when the vacuum degree of the pipe system 93 is reduced, the controller 30 determines that a wrinkle occurs in the tape 53, based on a sensing result of the suction sensor 63, and activates the vacuum device 82 as illustrated in FIG. 22B. Then, suction adhesion by the suction structure 24 is performed as illustrated in FIG. 23A.

For example, in a time period TP4 in FIG. 21, a relative distance between the bonding tool 20 and the stage 10 is controlled so that a pressure applied to the semiconductor chip 200 by the bonding tool 20 is kept substantially equal to a target pressure Fh=F1. At the same time, the temperature of the bonding tool 20 is controlled to a target temperature Th=T2 (>T1). Further, the vacuum degree of the pipe system 93 is monitored (S10). If the vacuum degree of the pipe system 93 becomes lower than a threshold value Pdth at a time t1 in the time period TP4, it is determined that the sensor is turned on (i.e., a wrinkle occurs), and the vacuum device 82 is activated. Then, the vacuum degree of the pipe system 92 is controlled to the target vacuum degree Ptr=P1 (>0).

Thereafter, the method is similar to that in the first embodiment in that processes at S11 to S15 (refer to FIG. 23B) are performed.

As described above, in the second embodiment, the semiconductor manufacturing apparatus 1701 checks the abnormality (occurrence of a wrinkle, for example) of the tape 53 via the check holes 25a to 25d provided near the suction structure 24. Then, the semiconductor manufacturing apparatus 1701 performs suction adhesion by the suction structure 24 in response to occurrence of abnormality. Therefore, suction adhesion of the tape 53 may be performed adaptively to abnormality (occurrence of a wrinkle, for example) of the tape 53, and thus abnormality of the tape 53 may be effectively suppressed.

Figure 24:
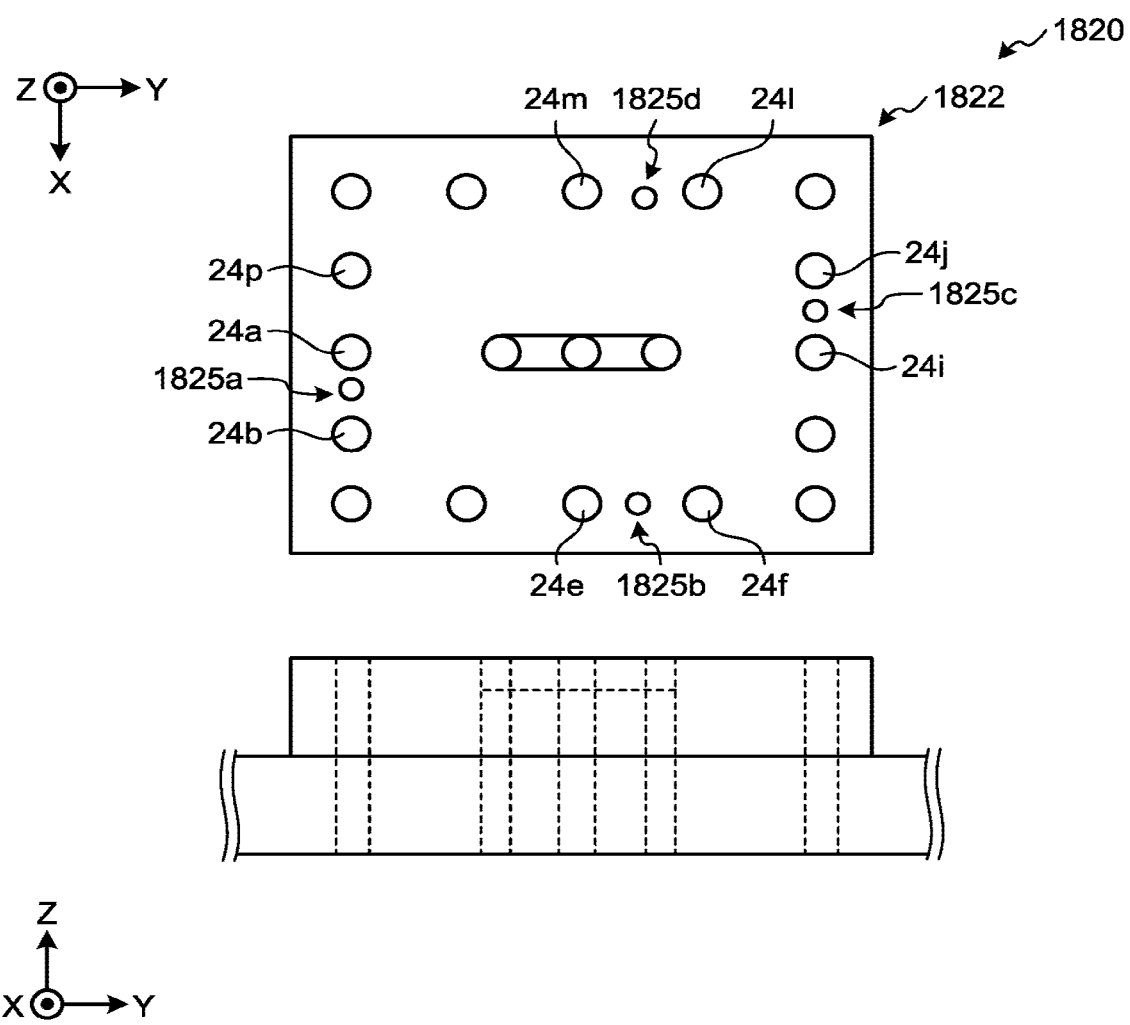
FIG. 24 is a view illustrating a configuration of a bonding tool in a modification of the second embodiment.

Additionally, a projection portion 1822 of a bonding tool 1820 may have a configuration in which each of check holes 1825a to 1825d is provided between two of a plurality of the suction holes 24a to 24p as illustrated in FIG. 24. FIG. 24 is a view illustrating the configuration of the bonding tool 1820 in a modification of the second embodiment. The check hole 1825a is provided between the suction hole 24a and the suction hole 24b. The check hole 1825b is provided between the suction hole 24e and the suction hole 24f. The check hole 1825c is provided between the suction hole 24i and the suction hole 24j. The check hole 1825d is provided between the suction hole 24l and the suction hole 24m. Also with this configuration, it is possible to perform suction adhesion of the tape 53 adaptively in response to the occurrence of abnormality (occurrence of a wrinkle, for example) of the tape 53.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
   a stage including a placement face, the placement face being a face on which a board and a semiconductor chip are placed, the semiconductor chip being a chip to be bonded to the board via a plurality of bump electrodes;
   a bonding tool including a front face, a first suction structure and a second suction structure, the front face facing the placement face, the first suction structure being arranged in a first region, the first region overlapping the semiconductor chip in the front face, the second suction structure being provided in a second region, the second region being arranged around the first region in the front face;
   a controller
      that relatively moves the bonding tool and the stage close to each other while causing the semiconductor chip to adhere by suction to the surface via a tape using at least the first suction structure in a first time period,
      that controls a temperature of the bonding tool to a first target temperature while keeping substantially equal to a target pressure a pressure applied to the semiconductor chip by the bonding tool in a second time period, the second time period being a period following the first time period,
      that controls a relative distance between the bonding tool and the stage so that the pressure applied to the semiconductor chip by the bonding tool is kept substantially equal to the target pressure and also controls the temperature of the bonding tool to a second target temperature in a third time period, the second target temperature being higher than the first target temperature, the third time period being a period following the second time period, and
      that relatively moves the bonding tool and the stage away from each other while cancelling suction adhesion by the first suction structure and the second suction structure in a fourth time period, the fourth time period being a period following the third time period;
a first exhaust pipe communicating with a space in the first suction structure; and
a second exhaust pipe provided independently of the first exhaust pipe, the second exhaust pipe communicating with a space in the second suction structure,
wherein the controller controls the space in the first suction structure via the first exhaust pipe so that the space in the first suction structure is decompressed and also controls the space in the second suction structure via the second exhaust pipe so that the space in the second suction structure is decompressed in the first time period, and releases the space in the first suction structure from decompression via the first exhaust pipe and also releases the space in the second suction structure from decompression via the second exhaust pipe in the fourth time period.

2. The semiconductor manufacturing apparatus according to claim 1, wherein
the controller causes the tape to adhere by suction to the surface using the second suction structure in the first time period, and relatively moves the bonding tool and the stage close to each other while causing the semiconductor chip to adhere by suction to the surface via the tape using the first suction structure.

3. The semiconductor manufacturing apparatus according to claim 1, wherein
the bonding tool further includes a check hole provided near the second suction structure in the surface, and
the controller relatively moves the bonding tool and the stage close to each other while causing the semiconductor chip to adhere by suction to the surface via the tape using the first suction structure in the first time period, and causes the tape to adhere by suction to the surface using the second suction structure when abnormality in a suction-adhesion state of the tape is detected via the check hole in the third time period.

4. The semiconductor manufacturing apparatus according to claim 3, further comprising:
a third exhaust pipe provided independently of the first exhaust pipe and the second exhaust pipe, the third exhaust pipe communicating with the check hole,
wherein
the controller controls the space in the first suction structure via the first exhaust pipe so that the space in the first suction structure is decompressed in the first time period, controls the space in the second suction structure via the second exhaust pipe so that the space in the second suction structure is decompressed when abnormality of the tape is detected via the third exhaust pipe and the check hole in the third time period, and releases the space in the first suction structure from decompression via the first exhaust pipe and also releases the space in the second suction structure from decompression via the second exhaust pipe in the fourth time period.

5. The semiconductor manufacturing apparatus according to claim 1, wherein
the second suction structure includes a groove extending along an outer edge of the first region.

6. The semiconductor manufacturing apparatus according to claim 1, wherein
the first suction structure includes a plurality of first suction holes arranged along a lengthwise direction of the bonding tool, and
the second suction structure includes a plurality of second suction holes arranged along an outer edge of the first region.

7. The semiconductor manufacturing apparatus according to claim 1, wherein
the second suction structure includes:
a step face;
a terrace face located adjacent to, and on an outside of, the step face; and
a suction hole provided in the terrace face.

8. A semiconductor manufacturing apparatus comprising:
a stage including a placement face, the placement face being a face on which a board and a semiconductor chip are placed, the semiconductor chip being a chip to be bonded to the board;
a bonding tool having a rectangular shape in plan view, the bonding tool including a front face, a first suction structure and a second suction structure, the front face facing the placement face, the first suction structure being arranged in a first region, the first region overlapping the semiconductor chip in the front face, the second suction structure being arranged in a second region, the second region being arranged around the first region in the front face,
wherein
the first suction structure includes a plurality of first suction holes arranged along a lengthwise direction of the bonding tool, and
the second suction structure includes a plurality of second suction holes arranged so as to surround the first region;
a first exhaust pipe communicating with the first suction holes;
a second exhaust pipe provided independently of the first exhaust pipe, the second exhaust pipe communicating with the second suction holes; and
a controller that controls decompression of the first suction holes via the first exhaust pipe and decompression of the second suction holes via the second exhaust pipe, independently of each other.

9. The semiconductor manufacturing apparatus according to claim 8, wherein
the second suction structure includes a groove extending along an outer edge of the first region.

10. The semiconductor manufacturing apparatus according to claim 9, wherein
the plurality of second suction holes are provided in the groove.

11. The semiconductor manufacturing apparatus according to claim 8, wherein
the second suction structure further includes:
a step face; and
a terrace face located adjacent to, and on an outside of, the step face, and
the plurality of second suction holes are provided in the terrace face.

12. The semiconductor manufacturing apparatus according to claim 8, wherein
the bonding tool further includes a check hole provided near the second suction structure in the front face.

13. The semiconductor manufacturing apparatus according to claim 12, further comprising:
a third exhaust pipe provided independently of the first exhaust pipe and the second exhaust pipe, the third exhaust pipe communicating with the check hole; and
a controller that controls decompression of the first suction holes via the first exhaust pipe, decompression of the second suction holes via the second exhaust pipe, and decompression of the check hole via the third exhaust pipe, independently of one another.

14. A method of manufacturing a semiconductor device comprising:
    placing a board and a semiconductor chip on a placement face of a stage in a semiconductor manufacturing apparatus, the board and the semiconductor chip being to be formed into a semiconductor device, the semiconductor chip being to be bonded to the board via a plurality of bump electrodes, the semiconductor manufacturing apparatus including the stage and a bonding tool, the bonding tool including a front face, a first suction structure and a second suction structure, the front face facing the placement face, the first suction structure being arranged in a first region, the first region overlapping the semiconductor chip in the front face, the second suction structure being arranged in a second region, the second region being arranged around the first region in the front face;
    relatively moving the bonding tool and the stage close to each other while causing the semiconductor chip to adhere by suction to the surface via a tape using at least the first suction structure;
    controlling a temperature of the bonding tool to a first target temperature while keeping to a target pressure a pressure applied to the semiconductor chip by the bonding tool;
    controlling a relative distance between the bonding tool and the stage so that the pressure applied to the semiconductor chip by the bonding tool is kept substantially equal to the target pressure and also controlling the temperature of the bonding tool to a second target temperature higher than the first target temperature; and
    relatively moving the bonding tool and the stage away from each other while cancelling suction adhesion by the first suction structure and the second suction structure,
    wherein
        the semiconductor manufacturing apparatus further includes:
            a first exhaust pipe communicating with a space in the first suction structure, and
            a second exhaust pipe provided independently of the first exhaust pipe, the second exhaust pipe communicating with a space in the second suction structure,
        the relatively moving the bonding tool and the stage close to each other includes controlling the space in the first suction structure via the first exhaust pipe so that the space in the first suction structure is decompressed and also controlling the space in the second suction structure via the second exhaust pipe so that the space in the second suction structure is decompressed, and
        the relatively moving the bonding tool and the stage away from each other includes releasing the space in the first suction structure from decompression via the first exhaust pipe and also releasing the space in the second suction structure from decompression via the second exhaust pipe.

15. The method of manufacturing a semiconductor device according to claim 14, wherein
    the relatively moving the bonding tool and the stage close to each other includes relatively moving the bonding tool and the stage close to each other while causing the tape to adhere by suction to the surface and causing the semiconductor chip to adhere by suction to the surface via the tape using the first suction structure.

16. The method of manufacturing a semiconductor device according to claim 14, wherein
    the bonding tool further includes a check hole, the check hole being arranged near the second suction structure in the surface,
    the relatively moving the bonding tool and the stage close to each other includes relatively moving the bonding tool and the stage close to each other while causing the semiconductor chip to adhere by suction to the surface via the tape using the first suction structure,
    the controlling the temperature of the bonding tool to the second target temperature includes causing the tape to adhere by suction to the surface using the second suction structure when abnormality in a suction-adhesion state of the tape is detected via the check hole.

17. The method of manufacturing a semiconductor device according to claim 14, wherein
    the semiconductor manufacturing apparatus further includes:
        a first exhaust pipe communicating with the first suction structure,
        a second exhaust pipe provided independently of the first exhaust pipe, the second exhaust pipe communicating with a space in the second suction structure, and
        a third exhaust pipe provided independently of the first exhaust pipe and the second exhaust pipe, the third exhaust pipe communicating with the check hole,
    the relatively moving the bonding tool and the stage close to each other includes controlling a space in the first suction structure via the first exhaust pipe so that the space in the first suction structure is decompressed,
    the controlling the temperature of the bonding tool to the second target temperature includes controlling the space in the second suction structure via the second exhaust pipe so that the space in the second suction structure is decompressed when abnormality of the tape is detected via the third exhaust pipe and the check hole, and
    the relatively moving the bonding tool and the stage away from each other includes releasing the space in the first suction structure from decompression via the first exhaust pipe and releasing the space in the second suction structure from decompression via the second exhaust pipe.

* * * * *